United States Patent
Krasnicki et al.

(10) Patent No.: US 9,536,028 B2
(45) Date of Patent: Jan. 3, 2017

(54) METHOD AND SYSTEM OF CHANGE EVALUATION OF AN ELECTRONIC DESIGN FOR VERIFICATION CONFIRMATION

(71) Applicant: ZIPALOG, INC., Plano, TX (US)

(72) Inventors: Michael Krasnicki, Richardson, TX (US); Yue Deng, Plano, TX (US)

(73) Assignee: Zipalog, Inc., Plano, TX (US)

(*) Notice: Subject to any disclaimer, the term of this patent is extended or adjusted under 35 U.S.C. 154(b) by 0 days.

(21) Appl. No.: 14/788,091

(22) Filed: Jun. 30, 2015

(65) Prior Publication Data

US 2015/0302125 A1 Oct. 22, 2015

Related U.S. Application Data

(63) Continuation of application No. 14/559,583, filed on Dec. 3, 2014, now Pat. No. 9,147,026, which is a continuation of application No. 13/929,007, filed on Jun. 27, 2013, now Pat. No. 8,930,877.

(51) Int. Cl.
G06F 17/50 (2006.01)

(52) U.S. Cl.
CPC ....... G06F 17/5045 (2013.01); G06F 17/5036 (2013.01); G06F 17/5063 (2013.01); G06F 17/5081 (2013.01)

(58) Field of Classification Search
CPC .................. G06F 17/5045; G06F 17/5081
USPC .................. 716/100–101, 106–107
See application file for complete search history.

(56) References Cited

U.S. PATENT DOCUMENTS

| | | | |
|---|---|---|---|
| 4,724,542 A | 2/1988 | Williford | |
| 5,790,416 A | 8/1998 | Norton et al. | |
| 6,370,677 B1 | 4/2002 | Carruthers et al. | |
| 6,668,362 B1* | 12/2003 | McIlwain | G06F 17/504 716/107 |
| 7,539,608 B1 | 5/2009 | Dageville et al. | |
| 2002/0010899 A1 | 1/2002 | Wallace | |
| 2006/0064655 A1* | 3/2006 | Horeth | G06F 17/504 716/107 |
| 2006/0184903 A1* | 8/2006 | Maruyama | G06F 17/5022 716/107 |
| 2009/0100395 A1 | 4/2009 | Carney et al. | |
| 2009/0293028 A1* | 11/2009 | Hiraoglu | G06F 17/504 716/106 |
| 2010/0218149 A1* | 8/2010 | Sasaki | G06F 17/5022 716/106 |
| 2010/0257494 A1 | 10/2010 | Pouarz et al. | |
| 2010/0313089 A1 | 12/2010 | Rajski et al. | |

(Continued)

OTHER PUBLICATIONS

PCT: International Search Report and Written Opinion of PCT/US2014/043004 (related application); Oct. 29, 2014; 18 pgs.

(Continued)

*Primary Examiner* — Stacy Whitmore
(74) *Attorney, Agent, or Firm* — Howison & Arnott, LLP

(57) ABSTRACT

A computer implemented method and system of change evaluation of an electronic design for verification confirmation. The method has the steps of receiving the electronic design comprised a subcomponent, employing a banked signature of data representative of the subcomponent, receiving a review request of the subcomponent, generating a current signature of the data representative of the subcomponent and determining a difference of the current signature and the banked signature.

20 Claims, 24 Drawing Sheets

(56) References Cited

U.S. PATENT DOCUMENTS

| | | |
|---|---|---|
| 2011/0102464 A1 | 5/2011 | Godavari |
| 2011/0107281 A1* | 5/2011 | Sun .................... G06F 17/5081 |
| | | 716/106 |
| 2011/0214096 A1 | 9/2011 | Sheeley et al. |
| 2011/0214097 A1* | 9/2011 | Nodine ................ G06F 17/504 |
| | | 716/107 |
| 2011/0239168 A1 | 9/2011 | Lei et al. |
| 2012/0266127 A1 | 10/2012 | Staiger et al. |
| 2013/0145329 A1 | 6/2013 | Brandt et al. |
| 2013/0174107 A1* | 7/2013 | Denler ................. G06F 17/505 |
| | | 716/102 |
| 2013/0298094 A1 | 11/2013 | Chen et al. |
| 2014/0129998 A1* | 5/2014 | Shrivastava .......... G06F 17/504 |
| | | 716/103 |
| 2014/0337811 A1* | 11/2014 | Knapp ................. G06F 17/505 |
| | | 716/104 |
| 2015/0106775 A1* | 4/2015 | Krasnicki ........... G06F 17/5036 |
| | | 716/107 |

OTHER PUBLICATIONS

PCT: International Preliminary Report on Patentability of PCT/US14/43004 (related application), Dec. 29, 2015, 13 pgs.

* cited by examiner

METHOD AND SYSTEM OF CHANGE EVALUATION OF AN ELECTRONIC DESIGN FOR VERIFICATION CONFIRMATION

CROSS-REFERENCE TO RELATED APPLICATIONS

This application is a Continuation of U.S. patent application Ser. No. 14/559,583, filed Dec. 3, 2014, published on Apr. 16, 2015 as U.S. Publication No. 2015-0106775, entitled METHOD AND SYSTEM OF CHANGE EVALUATION OF AN ELECTRONIC DESIGN FOR VERIFICATION CONFIRMATION. Application Ser. No. 14/559,583 is a Continuation of U.S. patent application Ser. No. 13/929,007, filed Jun. 27, 2013, published on Jan. 1, 2015, as U.S. Publication No. 2015-0007124, now U.S. Pat. No. 8,930,87, issued on Jan. 6, 2015, and entitled METHOD AND SYSTEM OF CHANGE EVALUATION OF AN ELECTRONIC DESIGN FOR VERIFICATION CONFIRMATION. U.S. application Ser. Nos. 14/559,583, and 13/929,007, U.S. Publication Nos. 2015-0106775 and 2015-0007124, and U.S. Pat. No. 8,930,877 are incorporated by reference herein in their entirety.

BACKGROUND

The method and system are generally related to the verification of analog and mixed signal integrated circuits.

Electronic design automation (EDA) is software for designing electronic blocks. There are several broad types of electronic signals, components and blocks, digital, analog and a mixture of digital and analog termed mixed signal. The electronic design generally comprises at least one of the following levels of circuit information, a system level, an architectural level, a dataflow level, an electrical level, a device level and a technology level and the like.

Digital signals have discrete input and output values "0" and "1", occurring at discrete time values, typically tied to a clock signal. Digital components which input and output the digital signals typically have static pin outs and interaction protocols. Digital blocks comprised of the digital components have well established and well documented physical layouts and electrical interactions. The simulators for digital blocks are discrete time event driven simulators.

Analog signals generally have continuous input and output values that may vary over time. Analog components typically have customizable layouts, in order to modify inputs, outputs, triggers, biases, etc. Therefore, due to customization, analog blocks comprised of the analog components, may not have well established or well documented physical layouts or electrical interactions. The simulators for analog blocks generally necessitate continuous time domain simulators.

Mixed signal blocks are a combination of digital signal blocks and analog signal blocks within a component being simulated. The most common options available for simulation are to simulate the component as a grouping of analog blocks, or, to separately analyze the analog components/blocks and the digital components/blocks and translate the inputs and outputs at the boundaries of the digital and analog domains for inter-domain communication.

Within EDA there are two broad categories of circuit review that are related, simulation and verification. Simulation is a numerical solution set that predicts the behavior of a circuit. Verification is the systematic pursuit of describing the behavior of a circuit under relevant conditions (functional verification) and over manufacturing process variation (parametric verification). Therefore, verification generally necessitates a much more extensive review of the circuit, its operating conditions and manufacturing operation variations than a simulation. It is possible to run a large number of simulations without verifying to any significant degree the functionality of a circuit. Verification is the mathematical modeling of circuit behavior and evaluation of circuit performance over a range of conditions. Ultimately, the measure of success of verification is to report how well the circuit design complies with the circuit specification. Analog and mixed signal verification methodology is struggling to keep pace with the complexity, cost, and computational demands of ever-growing analog and mixed signal circuits.

The number and complexity of verification test cases grows with the complexity of analog and mixed signal designs. Additionally, simulation speed decreases and memory utilization increases as the size of the circuit grows. Thus, the computational processing-power to verify a circuit may dramatically increase with circuit complexity. To make this issue more painful, verification occurs at the end of the design cycle where schedule delays are perceived to be most severe. Thus, verification is an activity that generally necessitates a significant amount of simulation processing-power for a small part of the overall design cycle, and the efficient use of verification resources is generally necessitated to meet time to market demands.

Today's complex verification solutions specifically focus engineering on the verification activity to ensure that the operation of the circuit is fully and efficiently verified under pertinent conditions. This focused analog and mixed signal verification is much more manual and experience driven than digital verification. This sporadic interactive analog verification leaves companies at risk. There is a long felt need for a more automated procedure to determine whether changes have occurred, their importance and the effect on the remainder of the circuit.

Robust verification of analog and mixed signal circuits generally necessitates a significant investment in test benches, performance analysis routines, and macro-models that may be used to accelerate the simulations. The complexity of this collateral grows with the complexity of the analog and mixed signal integrated circuits. As a design team adds design resources it also needs to add verification resources, adding to the cost of the design. The efficient use of those resources becomes paramount due to the inevitable time constraints that are imposed at the end of the design cycle, when companies are trying to get a product to market.

The current technology trajectory within the electronics manufacturing industry is to move more and more toward single chip designs, called Systems on a Chip (SoC). Most systems on a chip generally necessitate some level of mixed signal verification. As mixed signal designs continue to increase in size and complexity, this places additional burdens on verification to insure first pass design success and reducing time-to-market. Although the complexity of analog and mixed signal ASIC design has aggressively followed Moore's law, innovations in design verification generally have not.

Valuable design time and compute resources as well as expensive simulator resources may be specifically focused by the disclosed method for achieving targeted coverage on non-equivalent changes rather than the current ad-hoc approach. The method identifies areas that need to be re-verified and provide nearly immediate feedback to the design team and design management. Improving test coverage efficiency (i.e., not wasting simulation time) allows more efficient use of resources.

This disclosure is related to evaluating changes to an electronic design for confirming verification for analog and mixed signal (A/MS) application specific integrated circuits (ASICs). Analog and mixed signal integrated circuits exist in many modern electronic devices, and these circuits needs to be verified through simulation prior to fabrication. Aspects of verification confirmation include determining whether a change occurred, if a change did occur, did it result in an equivalent circuit, and if the change occurred and the circuit is not equivalent, what are the subsequent effects on the overall circuit.

Therefore the disclosure implements improved verification efficiency through determining whether a change has occurred, determining whether the modified circuit is equivalent and to determine the subsequent effects of the circuit modification. These and other potential advantageous, features, and benefits of the present disclosure may be understood by one skilled in the arts upon careful consideration of the detailed description of representative examples of the disclosure in connection with the accompanying drawings.

SUMMARY

There is provided according to one example and it's aspect of the present disclosure of a method of change evaluation of an electronic design for verification confirmation that has the steps of receiving the electronic design comprised of a subcomponent and employing a banked signature of data representative of the subcomponent. The example has the steps of receiving a review request of the subcomponent, generating a current signature of the data representative of the subcomponent and determining a difference based upon the current signature and the banked signature.

BRIEF DESCRIPTION OF THE DRAWINGS

The present disclosure will be more clearly understood from consideration of the following detailed description and drawings in which.

Figure 1:
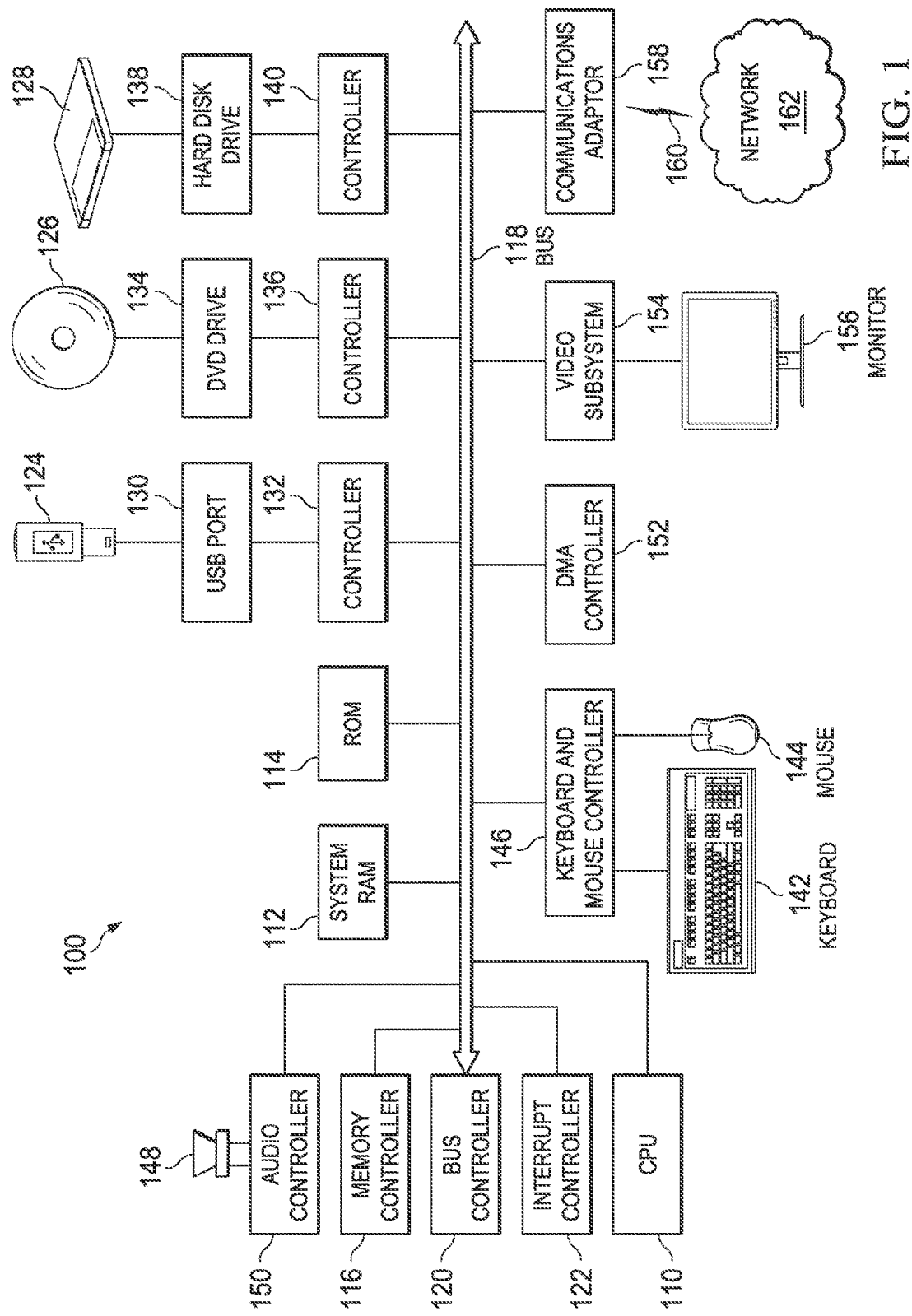
FIG. 1 is a block diagram showing a computer system suitable for practicing the instant disclosure.

References in the detailed description correspond to like references in the various drawings unless otherwise noted. Descriptive and directional terms used in the written description such as right, left, back, top, bottom, upper, side, et cetera, refer to the drawings themselves as laid out on the paper and not to physical limitations of the disclosure unless specifically noted. The drawings are not to scale, and some features of examples shown and discussed are simplified or amplified for illustrating principles and features as well as advantages of the disclosure.

DETAILED DESCRIPTION

The features and other details of the disclosure will now be more particularly described with reference to the accompanying drawings, in which various illustrative examples of the disclosed subject matter are shown and/or described. It will be understood that particular examples described herein are shown by way of illustration and not as limitations of the disclosure. Furthermore, the disclosed subject matter should not be construed as limited to any of examples set forth herein. Rather, these examples are provided so that this disclosure will be thorough and complete, and will fully convey the scope of the disclosed subject matter to those skilled in the art. The principle features of this disclosure may be employed in various examples without departing from the scope of the disclosure.

The terminology used herein is for the purpose of describing particular examples only and is not intended to be limiting of the disclosed subject matter. Like number refer to like elements throughout. As used herein the term "and/or" includes any and all combinations of one or more of the associated listed items. Also, as used herein, the singular forms "a", "an", and "the" are intended to include the plural forms as well, unless the context clearly indicates otherwise. It will be further understood that the terms "comprises", and/or "comprising" when used in this specification, specify the presence of stated features, integers, steps, operations, elements, and/or components, but do not preclude the presence or addition of one or more other features, integers, steps, operations, elements, components, and/or groups thereof. Also, as used herein, relational terms such as first and second, top and bottom, left and right, and the like may be used solely to distinguish one entity or action from another entity or action without necessarily requiring or implying any actual such relationship or order between such entities or actions.

Cost of entry barriers into analog and mixed signal IC design is endemic especially to fabless companies that are developing ASIC intellectual property in the form of packaged ASICs or modules to be integrated into their customer's Systems-on-Chip (SoCs). For example, if a fabless design center is staffed with five IC design engineers, equipping the team with design tools is financially equivalent to quadrupling the staff. This is due to the high cost of ownership of the EDA tools, not just in annual license fees, installation and support, training and the like. Reducing system use through intelligent change management tracking and assessment allows more efficient resource allocation.

Analog and mixed signal verification is time and compute intensive. Functionality of the circuit for various inputs, at various conditions and for various manufacturing conditions are generally necessitated to be simulated to insure that the circuit functions to the specifications. Overlapping the time and compute intensiveness of the original verification is that multiple design teams may be reviewing or modifying aspects of the design. Evaluating whether a change has occurred, whether this change results in an equivalent circuit and the subsequent effects of these non-equivalent changes becomes paramount in confirming whether the circuit has been adequately verified.

The present disclosure addresses whether any modification of the circuit has occurred. If there has been no modification of the circuit, no additional verification confirmation issues need to be addressed although additional verifications may be performed. Sometimes it is not possible to look at the latest update timestamp of a file to determine whether a modification has occurred, as opening the file may index the date and indicate a false positive. Generating a current signature for the file after it is opened allows it to be compared against a banked signature of the file. If there is a difference between the banked and current signature it may be inferred that an actual file change occurred. The type of signatures that may be associated with a banked file may be cryptographic, time based, data bit based and the like, this signature may be banked with and stored with the file or as an alternative be generated on the fly. It is also envisioned that the current signature and or the banked signature may be forced to be generated by the user at the user's choosing.

After indication that a portion of the design file has been changed, other issues may need to be addressed. One of those issues is whether the indicated change results in a non-equivalent circuit. Non-equivalencies may or may not result from circuit changes. If the modified circuit is analyzed to be equivalent, verification confirmation issues may be reduced. Multiple different methods of equivalence evaluation for a circuit exist, such as recognizing the structural schematic differences between the original and modified subcomponents, mapping of eigenvalues of the original and modified subcomponents, mapping between behavioral and electrical domains and calculating of deviation between the behavioral and electrical implementation of the original and modified subcomponents, mapping netlist of the original and modified subcomponents, mapping the stamped matrix of the original and modified subcomponents and the like.

If it is assessed that the file has indeed been modified, the extent of the effect of the design file change on the overall design and its verification may be assessed. Among the steps to address this issue comprise receiving a verification history, tracking a lineal subcomponent that is hierarchically related to the modified subcomponent, providing a consequence log based upon a determined difference and the lineal subcomponent and assessing a verification delta based upon the consequence log and the verification history. The consequence log indicates an effect upon the electronic design resulting from the modified subcomponent. A verification delta may include any item in a specific test configuration that was affected by a change in one subcomponent within that configuration that was previously verified. If the change in the subcomponent affected the previous verification output, then a verification delta is detected.

Therefore among the issue solved by the disclosed system and method of change evaluation is to allows more efficient use of computer and personnel resources, reduce the time lag to market and insure a more focused and thorough verification confirmation.

Computer System FIG. 1 illustrates the system architecture for an exemplary computer system 100 with which the current disclosure may be implemented. The exemplary computer system of FIG. 1 is for descriptive purposes only. Although the description may refer to terms commonly used in describing particular computer systems, such as an IBM personal computer, the description and concepts equally apply to other systems, including systems having architectures dissimilar to FIG. 1.

Computer system 100 typically includes a central processing unit (CPU) 110, which may be implemented with one or more microprocessors, a random access memory (RAM) 112 for temporary storage of information, and a read only memory (ROM) 114 for permanent storage of information. A memory controller 116 is provided for controlling RAM. A bus 118 interconnects the components of the computer system. A bus controller 120 is provided for controlling the bus. An interrupt controller 122 is used for receiving and processing various interrupt signals from the system components. Mass storage may be provided by flash 124, DVD 126, or hard disk 128, for example a solid-state drive. Data and software may be exchanged with the computer system via removable media such as the flash drive and DVD. The flash drive is insertable into a Universal Serial Bus, USB, drive 130, which is, in turn, connected to the bus by a controller 132. Similarly, the DVD is insertable into DVD drive 134, which is, in turn, connected to bus by controller 136. Hard disk is part of a fixed disk drive 138, which is connected to the bus by controller 140.

User input to the computer system may be provided by a number of devices. For example, a keyboard 142 and a mouse 144 are connected to the bus by a controller 146. An audio transducer 148, which may act as a microphone and a speaker, is connected to bus by audio controller 150, as illustrated. Other input devices, such as a pen and/or tabloid, may be connected to the bus and an appropriate controller and software. DMA controller 152 is provided for performing direct memory access to the system RAM.

A visual display is generated by video subsystem 154, which controls video display 156. The computer system also includes a communications adaptor 158, which allows the system to be interconnected to a local area network (LAN) or a wide area network (WAN) or other suitable network, schematically illustrated by a bus 160 and a network 162.

Operation of the computer system is generally controlled and coordinated by an operating system, such as the Windows and Windows 7 operating systems, available from Microsoft Corporation, Unix, Linux or Apple OS X operating system, to name a few. The operating system controls allocation of system resources and performs tasks such as processing scheduling, memory management, networking, and I/O services, among other things.

Figure 2:
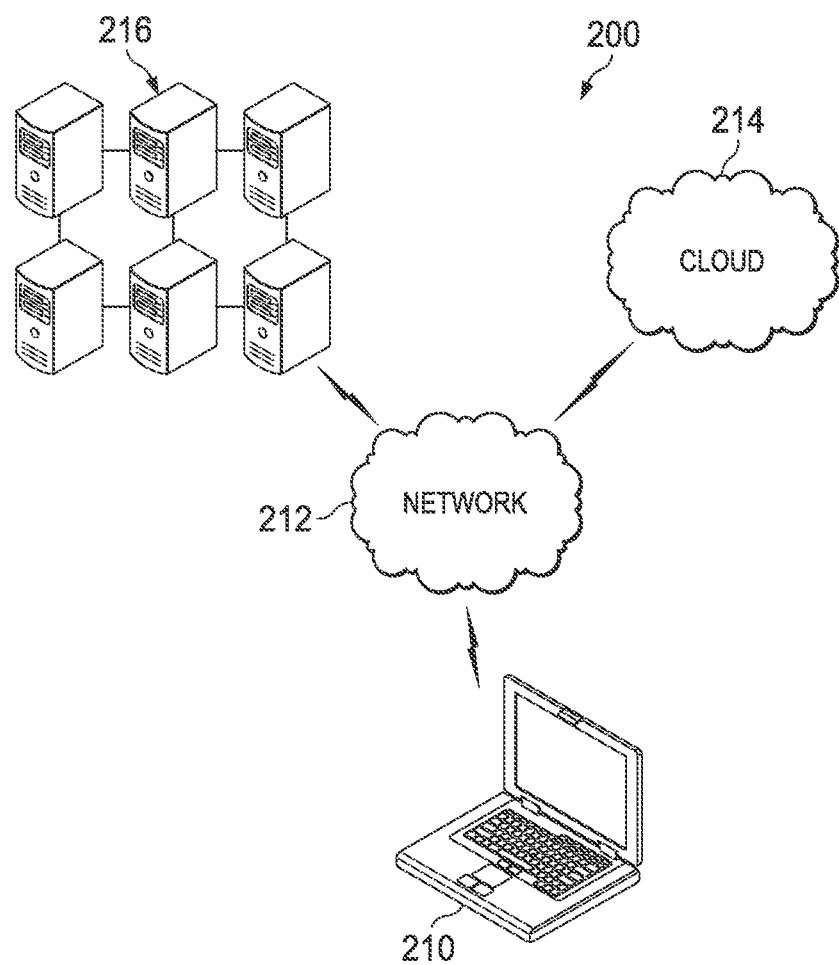
FIG. 2 is a block diagram showing a computer network system suitable for practicing the instant disclosure.

Computer System FIG. 2 illustrates the system 200 in which the computer user 210 is connected to a network 212 which in turn is connected to the cloud 214 and the compute farm 216.

Figure 3:
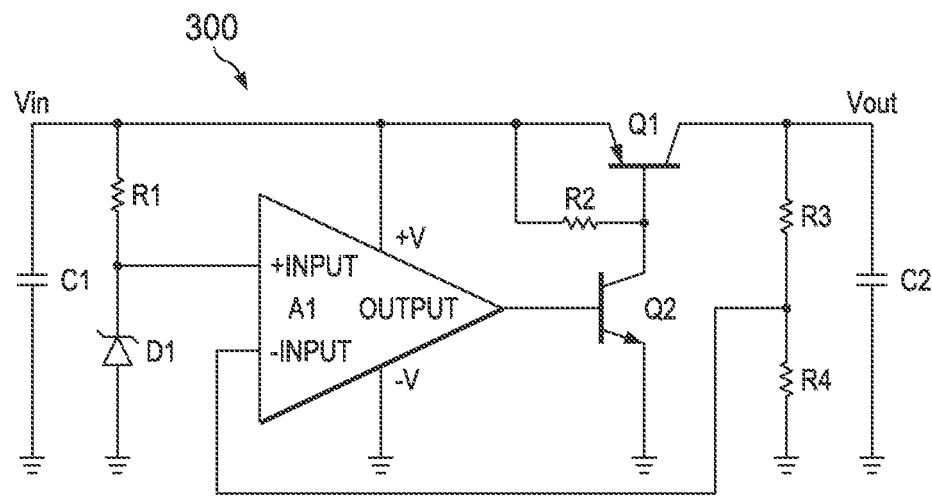
FIG. 3 depicts an example Low Voltage Dropout (LDO) circuit.

An example schematic of a low voltage dropout (LDO) 300 circuit is shown in FIG. 3. The LDO has an amplifier A1, having an inverting input (−input), a non-inverting input (+input) an output, a positive power supply voltage input +V and a negative power supply voltage input −V. The LDO circuit has a voltage in Vin and a voltage out Vout. The LDO has a power out block Q1, Q2 and R2. The LDO feedback circuit is comprised of R3, R4, D1 and R1. The amplifier A1 is termed a symbol, the elements D1, R1, R2, R3, R4, C1, C2, Q1 and Q2 are referred to as primitives.

Figure 4:
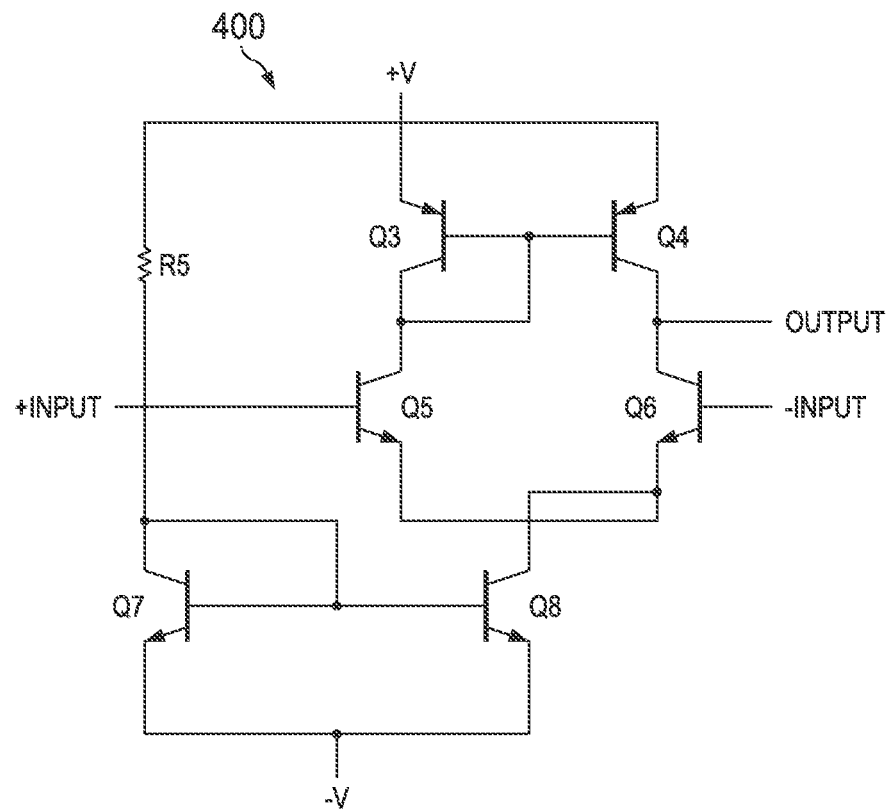
FIG. 4 depicts an example amplifier circuit.

An example schematic of an amplifier A1 400 circuit is shown in FIG. 4. The symbol of the amplifier is comprised of transistors Q3, Q4, Q5, Q6, Q7 and Q8 and resistor R5. The amplifier A1, having an inverting input (−input), a non-inverting input (+input) an output, a positive voltage input +V and a negative voltage input −V.

Figure 5:
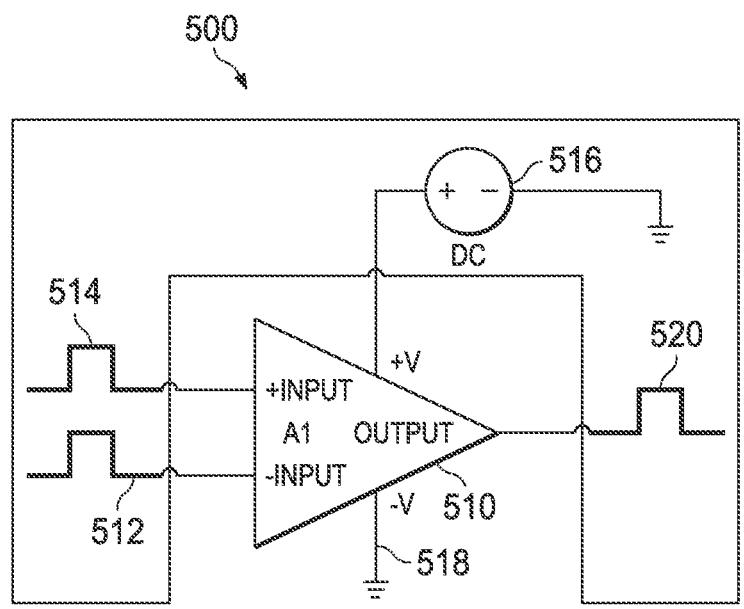
FIG. 5 depicts a test bench pin out for an amplifier.

FIG. 5 shows a test bench 500 for amplifier A1 510. A test bench is a specific configuration of inputs, outputs, test conditions and the like that are run for a device to which it is connected. The test bench has an inverting input 512, a non-inverting input 514, a positive power input 516, a negative power input 518 and an output 520. The test bench has associated connections, power supplies, IOs, etc. which are referred to as the test bench collateral. The portion around the periphery of the circuit is referred to as the verification harness. Pin outs and the operation of the verification harness need to be matched to the circuit under test.

Figure 6:
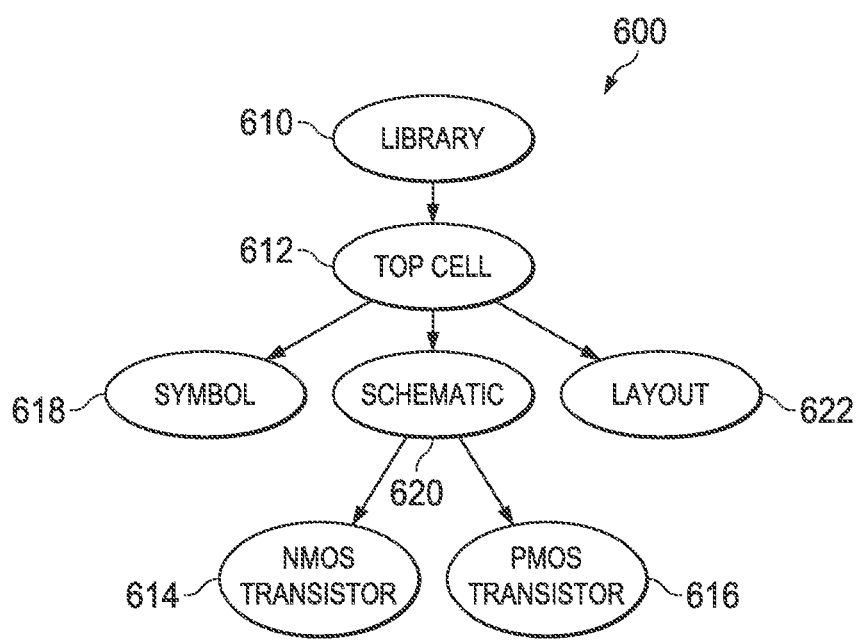
FIG. 6 depicts an example hierarchy.

FIG. 6 shows one example hierarchy 600. Integrated circuit designs are managed hierarchically in order to handle the complexity and volume of information. For analog and mixed-signal integrated circuit designs, design engineers often interpret the design as a hierarchy of schematics however; multiple representations of the design data may typically be utilized to release the design to the manufacturing process. The operational amplifier shown in FIG. 5 may represent one such example. The design may be contained in a library comprising the cells and the various design representations at the different levels of the hierarchy. In this example, the library 610 may contain the top cell 612, in this case the operational amplifier, and primitive device types used in the design such as NMOS 614 and PMOS 616 transistors. In this example, the top cell has three design representations: a symbol view 618 such as the symbol for the op amp used in FIG. 5, a schematic view 620 of the individual devices that comprise the op amp, and a layout view 622 that may include the shapes and layers to generate a mask set for production. Placed inside the schematic view may be the symbols of primitive devices. Specific primitive devices may be placed multiple times with either the same or different values for parameters such as width and length. These placements are considered an instance of that device. More complex examples of design hierarchies may be seen in FIGS. 8-12.

Figure 7:
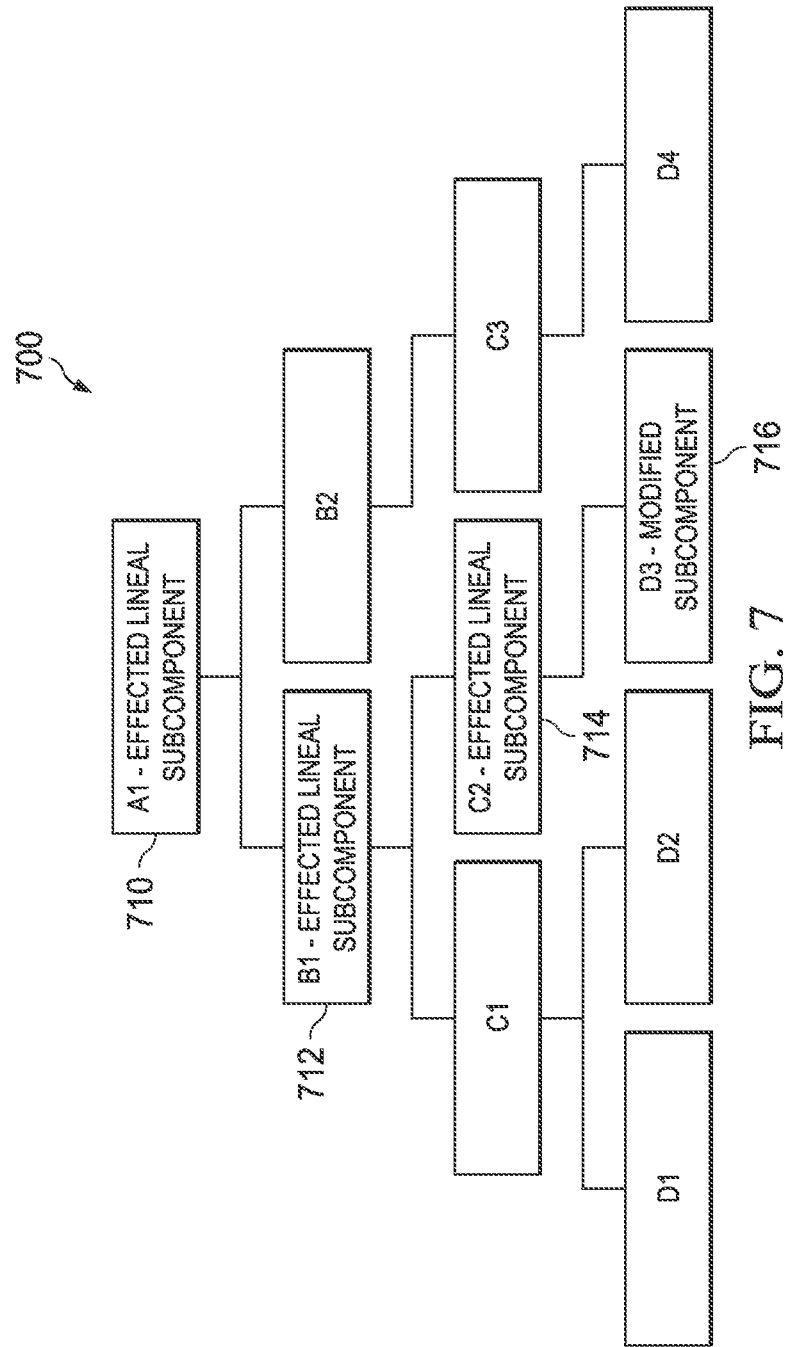
FIG. 7 depicts an example hierarchy showing a modified subcomponent and the effected lineal subcomponents within that design representation.

FIG. 7 depicts an example hierarchy within the design representation 700. For instance, if A1 710 is the schematic of a Power Management Integrated Circuit (PMIC) design that contains a placement of B1 712 which is the schematic view of a low dropout regulator. B1 contains a placement of C2 714 which is a schematic view of an amplifier and feedback loop. The C2 schematic view may include a schematic view of an amplifier D3. If the schematic view for D3 716 is changed, any evaluations performed that contained D3 are now suspect and need to be re-evaluated. Therefore evaluations using A1, B1, and/or C2 are suspect as well as evaluations performed on D3. More detailed examples may be seen in FIGS. 8-12.

Figure 8:
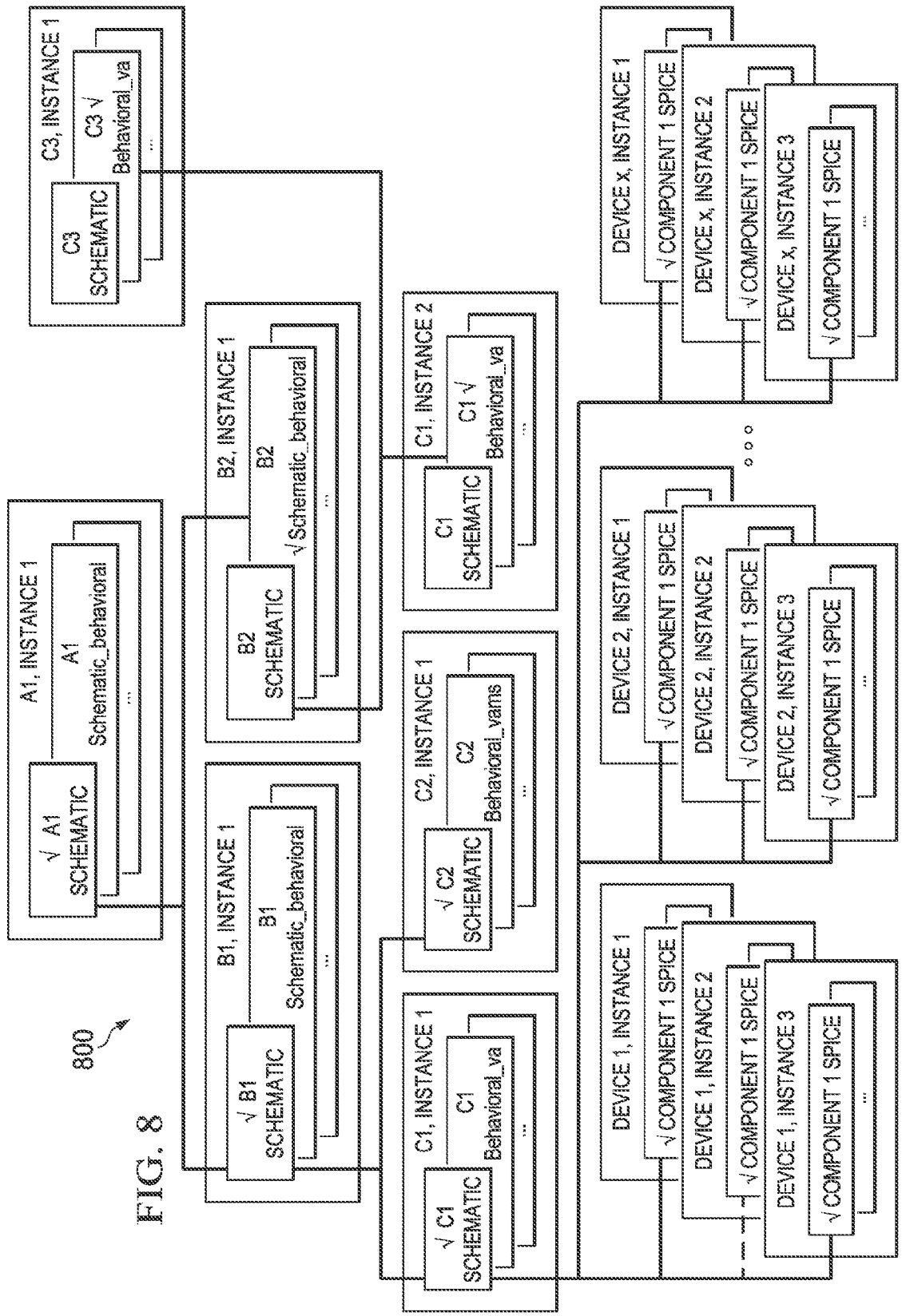
FIG. 8 depicts a general example hierarchy.

FIG. 8 shows a general example hierarchy 800 of a device under test, DUT. The hierarchy is arranged according to levels, A, B, C and Device and according to instances 1, 2 and 3. The connecting lines indicate which representations are connected throughout the hierarchy for a specific verification. Within level and instance, multiple view types may exist. The examples illustrate some possible hierarchical configurations and are not intended to limit the cases and views or view types.

Integrated circuit design hierarchy is the representation of integrated circuit designs utilizing hierarchical representations. This representation allows for more efficient creation of complex designs that may include millions of components such as transistors, resistors, and capacitors as well as the metal lines that connect the devices. The design hierarchy representation used at any given point in the design process may vary based on the design step being performed and the type of design function such as analog, digital, or memory.

In the case that a design is to be manufactured, a layout of the design is created so that a representation may be mapped. This mapping allows patterns to be created on individual levels of the mask sets to allow design manufacture. In general, the design flow to create the layout representation is very different for analog as compared to digital functional blocks and subsystems.

Early in the design process, there may be large portions of the design that are designed for the first time and do not have any existing layout representations. Other portions of the design may already have been proven, and these may be represented at a higher level of abstraction or may include the layout representation.

Some common types of design representations referred to here as views may comprise various view types. A Schematic view type is a picture of components or blocks with connectivity shown by lines or nets and connections to other levels of the hierarchy through pins. A Spice view type is a representation of a component and its associated parameters, possibly including a specific device model that will be instantiated into the spice netlist. An LVSExtract is a view type that is created by a tool analyzing the layout view and reverse engineering the individual components and connectivity. Variations of this type of view may also include extracted parasitic components resulting from the physical layout that were not drawn by the designer. A Layout view type is a representation of the specific geometries including routing for that portion of the design. A Verilog view type is a text file that is in standardized Verilog format. A Verilog-A view type is a text file in standardized Verilog-A format. A Verilog-AMS view type is a text file in standardized Verilog-AMS format. View type names may be different depending on the electronic design automation tool provider.

Other types of view types may help organization and readability of the hierarchy. As an example, graphic design tools such as schematic capture systems may use a symbol view type for the graphic that is placed. The symbol may contain pins that connect the instance through the hierarchy as well as a drawing that indicates the function of the block.

Examples include common symbols for operational amplifiers, basic digital gates, transistors, resistors, and the like.

Further adding to the complexity of description, a given block at a level of the design hierarchy may include multiple views of the same view type. An example would be different verilog representations of a given block, for instance, one with annotated timing based on the layout, one with estimated timing, one without timing, or different levels of design representation such as gate-level or register transfer level RTL. Similarly, an analog view may have numerous schematic views for instance, one that will map to the final transistor-level design, one that includes placement of behavioral blocks for higher level modeling, one that may include parasitic elements from the layout, one that includes interface elements between analog and digital blocks for mixed-signal simulation. Also, for analog blocks there may be multiple Verilog-A or Verilog-AMS model views for the same block where models include different functionality and accuracy based on the purpose of different simulation exercises. These multiple views and view types are mapped into configurations that are used for a specific task or analysis.

Often view names are created to provide hints for what types of analysis a specific view may be useful. View names may include those listed hereinafter and the like. A Schematic is a schematic view including the placement of blocks that may be evaluated at the transistor level or at some level of the hierarchy such as a behavioral model. A Schematic_behavioral is a schematic view that comprises behavioral elements. A Schematic_parasitics is a schematic view that includes parasitic components extracted or estimated from the layout. A Spice is a spice view that includes the information implemented in a netlist and a component for a specific analog simulator. A Behavioral_va is a text view in the Verilog-A format that models a specific block for an analog simulator that may evaluate Verilog-A, and a Behavioral_vams is a text view in the Verilog-AMS format that models a specific block for a mixed-signal simulator that may evaluate Verilog-A and Verilog.

In the specific example shown in FIG. 8, Test bench 1, with device under test A1, Instance 1, would be defined based on the following configuration, A1, Instance 1 and B1, Instance 1 are modeled with a Schematic level model. B2, Instance 1 is modeled with a Schematic_behavioral model, and C1, Instance 1 and C2 Instance 1 are modeled using a Schematic model. C1, Instance 2 and C3, Instance 1 are modeled with a Schematic_behavioral model. At the bottom of the hierarchy Device 1, 2 through x, instances 1, 2 and 3 are modeled using Spice.

In the specific example shown in FIG. 8, Device 1, Instance 2 is a dummy device and therefore would not change the simulator matrix. Device 1, Instance 2 is placed in the C1, Instance 1 schematic connected as a dummy device and is therefore not part of the A1, Instance 1 matrix that would be stamped in the simulator.

Whether a change necessitates a verification to be rerun is determined in part by the connections through the hierarchy. In this specific example for Test bench 1, device under test A1, Instance 1, if Device 1, Instance 2, Schematic view is changed the simulator would not need to be rerun, since the device is a dummy device and would not modify the matrix that would be stamped into the simulator.

With a view to FIG. 8, C1, Instance 1 Schematic view forms part of the configuration of the simulator model, if it is changed and the change is substantive enough to affect the simulator matrix, Test bench 1 would need to be rerun. C1, Instance 2 Schematic view would not form a part of the configuration of the simulator model example; therefore, if it is changed, Test bench 1 would not need to be rerun.

At a more abstract level, if C1, Schematic view is changed, therefore changing the schematic view in Instance 1 and 2, which affects a change in the information stamped in the simulator matrix, Test bench 1 would need to be rerun. If a non-substantive change to C1, Schematic view is made for example by adding a comment and no change is made to the information stamped by the simulator in the matrix, Test bench 1 would not need to be rerun. It is apparent that determining whether a change was made to a configuration and the effect of the stamping of the matrix, may have a large effect on the number of necessitated verification runs.

Figure 9:
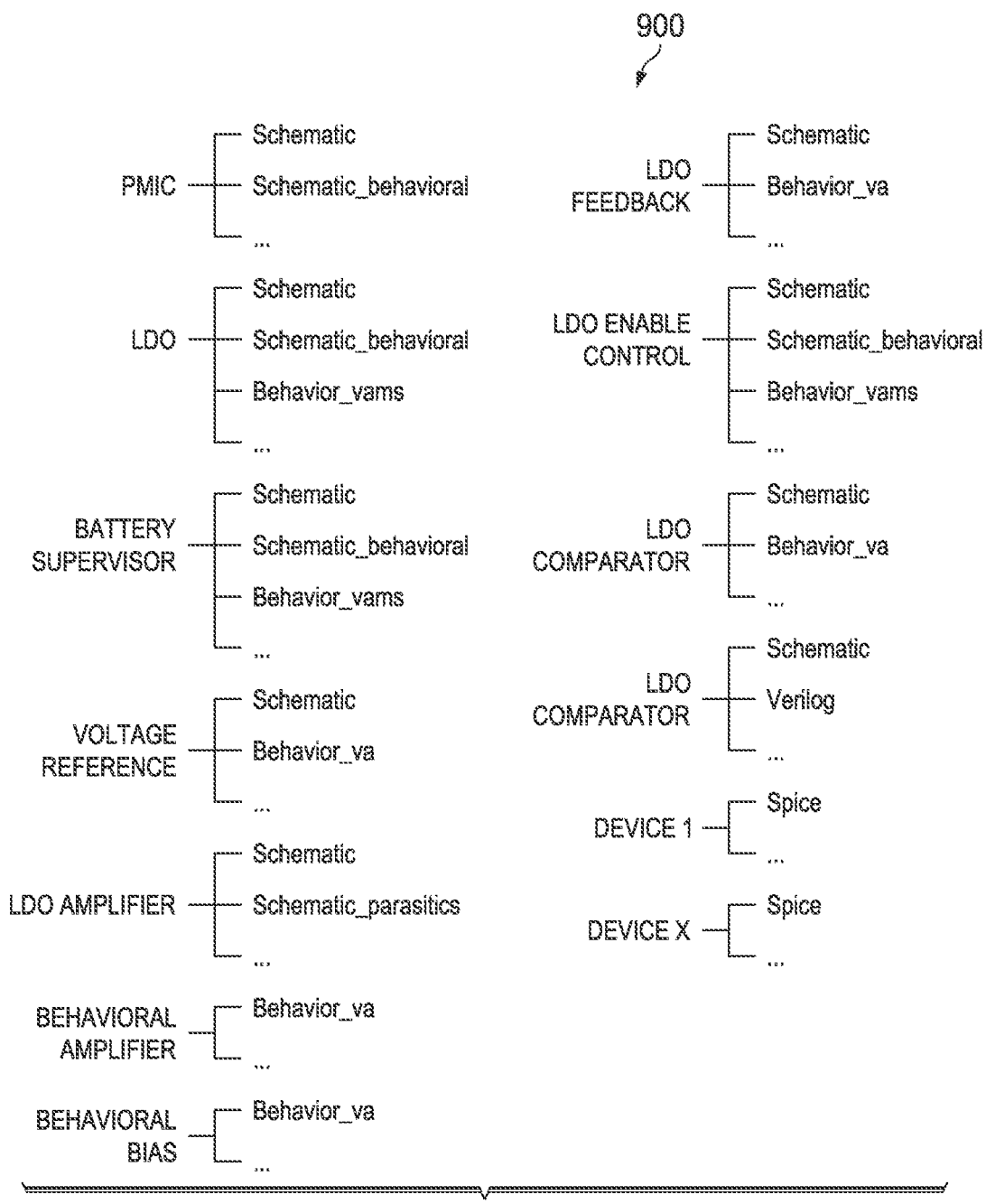
FIG. 9 depicts an instance parsed example test hierarchy.

FIG. 9 shows some of the different model views that may be chosen from for modeling a power management chip PMIC 900. The PMIC has Schematic and Schematic_behavioral levels. The LDO, LDO Enable Control and Battery Supervisor are defined at the Schematic, Schematic_behavioral and Behavioral_vams levels. The Voltage Reference, LDO Feedback and LDO Comparator are defined at the Schematic and Behavioral_va levels. The LDO Amplifier is defined at the Schematic and Schematic_parasitics levels. The Behavioral Amplifier and Behavioral Bias are defined at the Behavior_va level. The LDO Control Logic is defined at the Schematic and Verilog levels, and Devices 1 through X are defined at the Spice level.

Figure 10A:
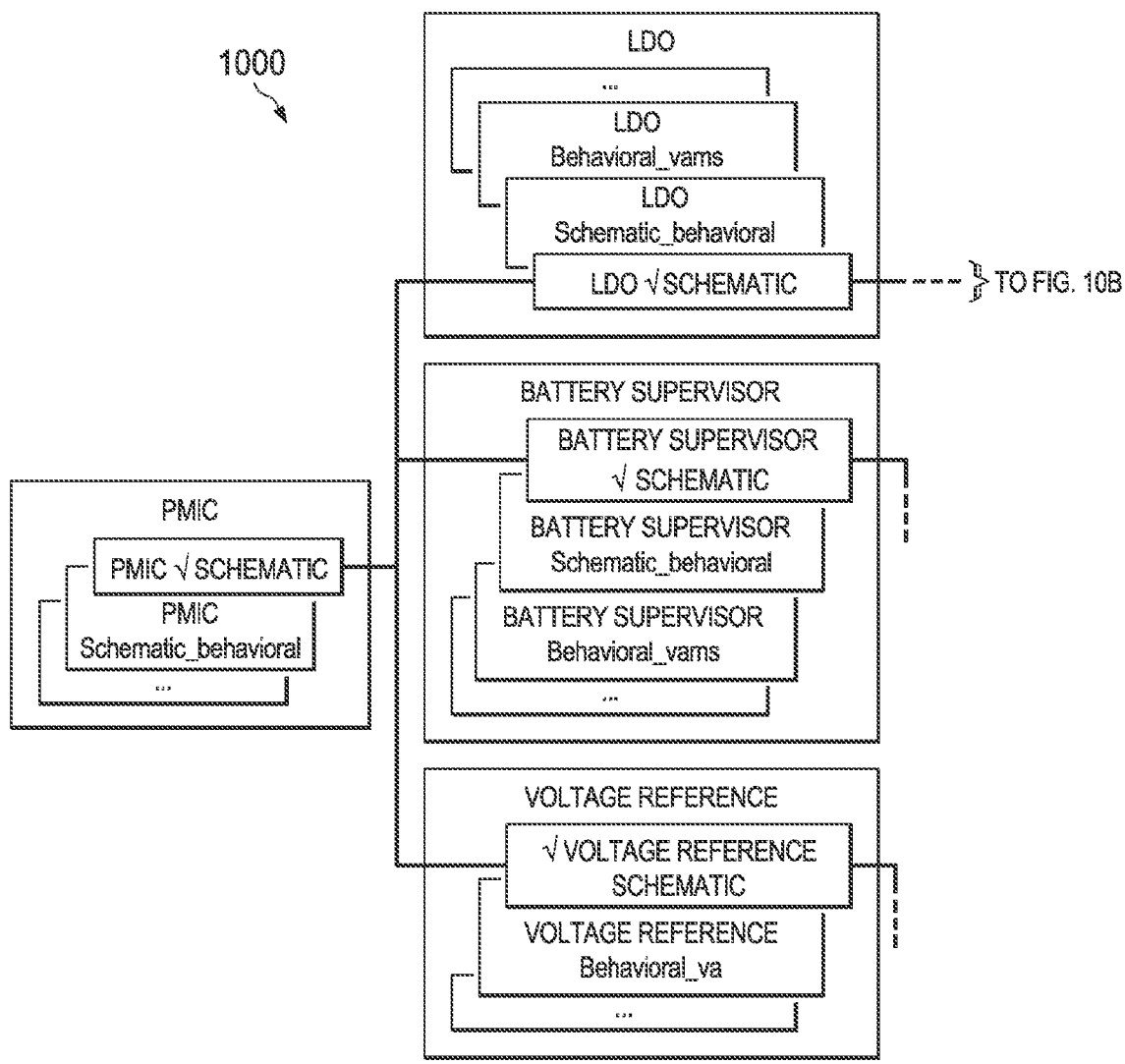
FIGS. 10A and 10B depict a first example design configuration for a power management integrated circuit.
Figure 10B:
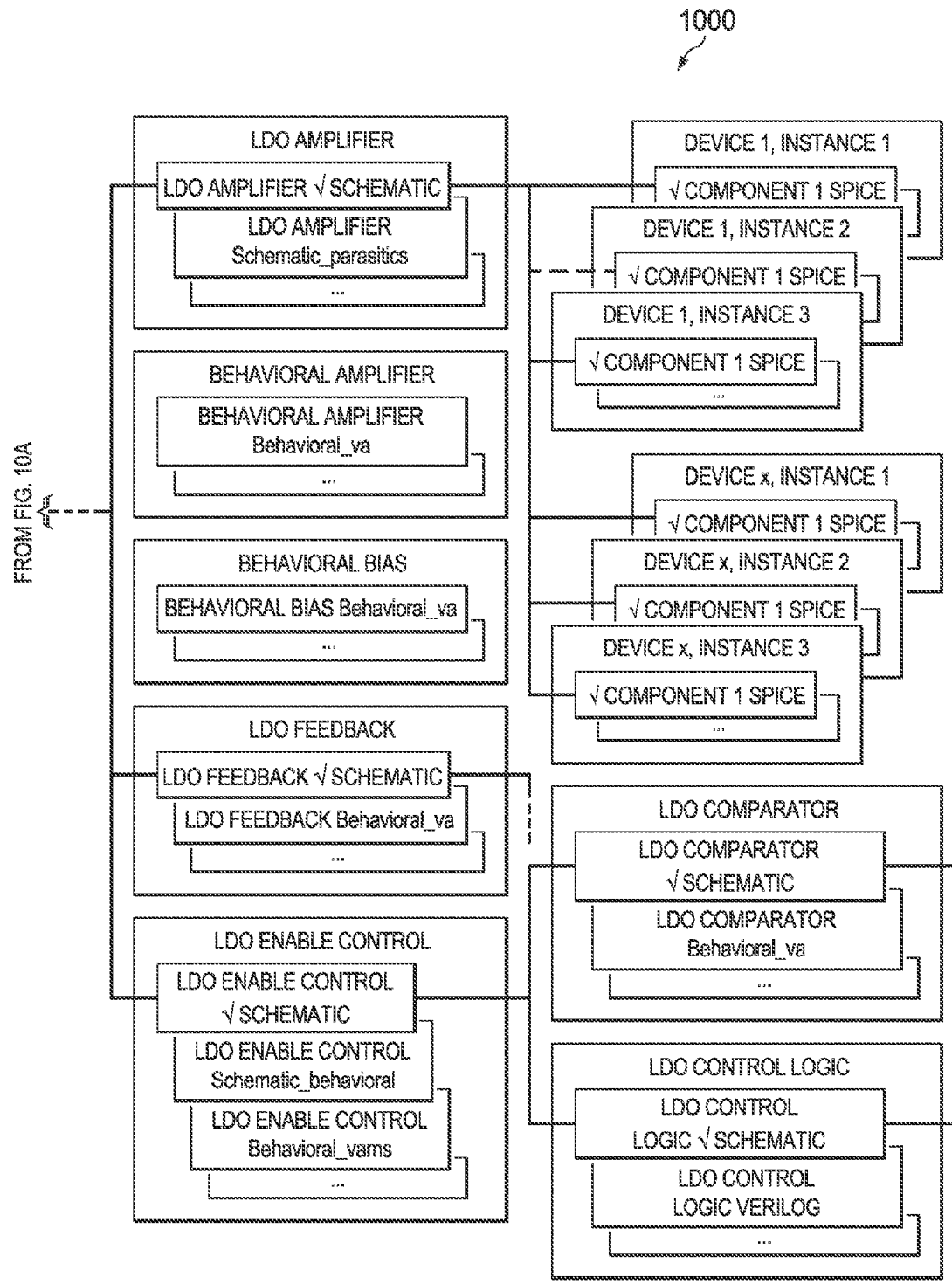

FIGS. 10A and 10B show a test hierarchy for a power management chip 1000. The figure illustrates a portion of the hierarchy if a Spice primitive component configuration is defined. Device 1, Instance 2 is a dummy device in this model and would not change the simulator matrix.

Figure 11A:
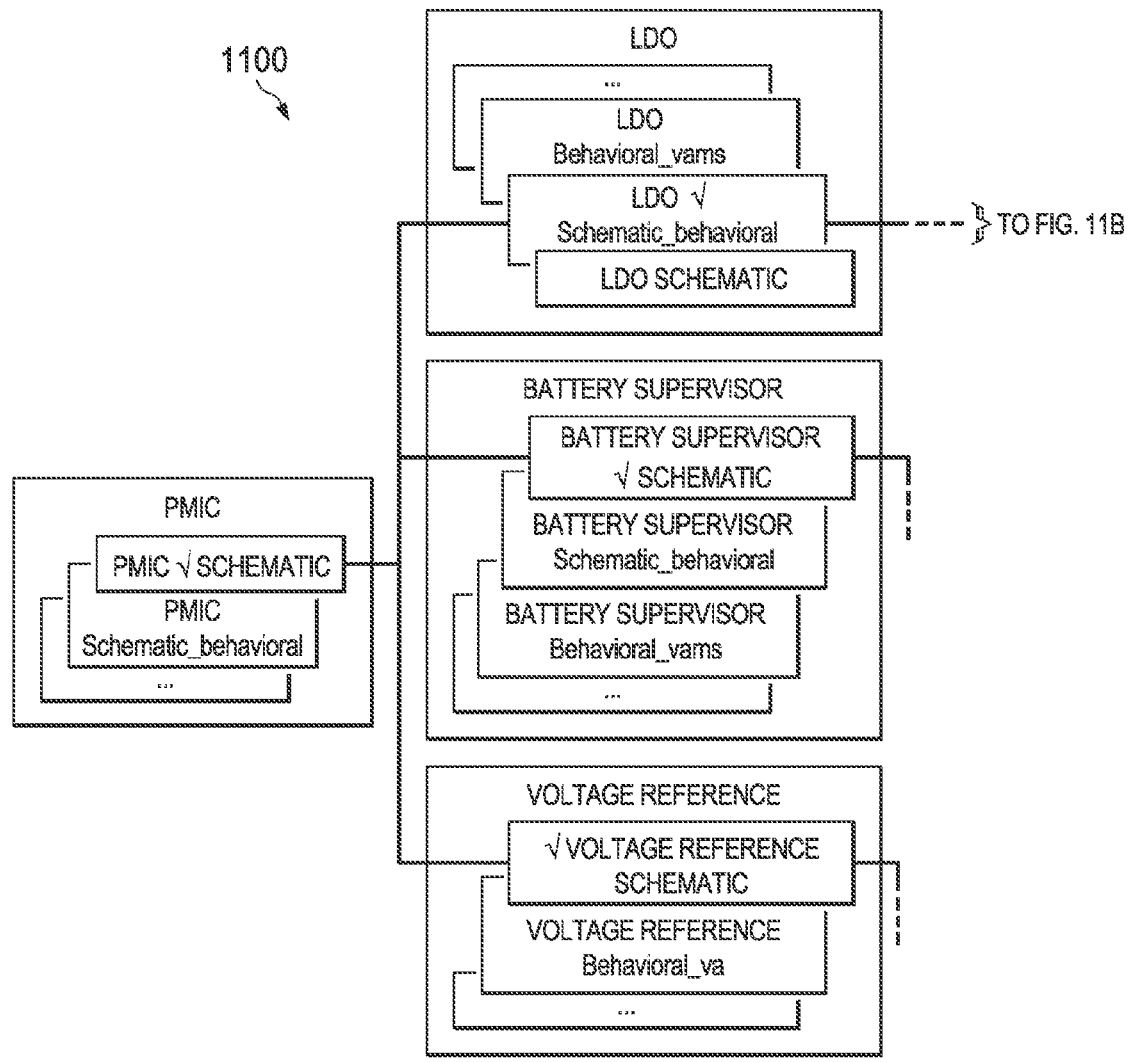
FIGS. 11A and 11B depict a second example design configuration for a power management integrated circuit.
Figure 11B:
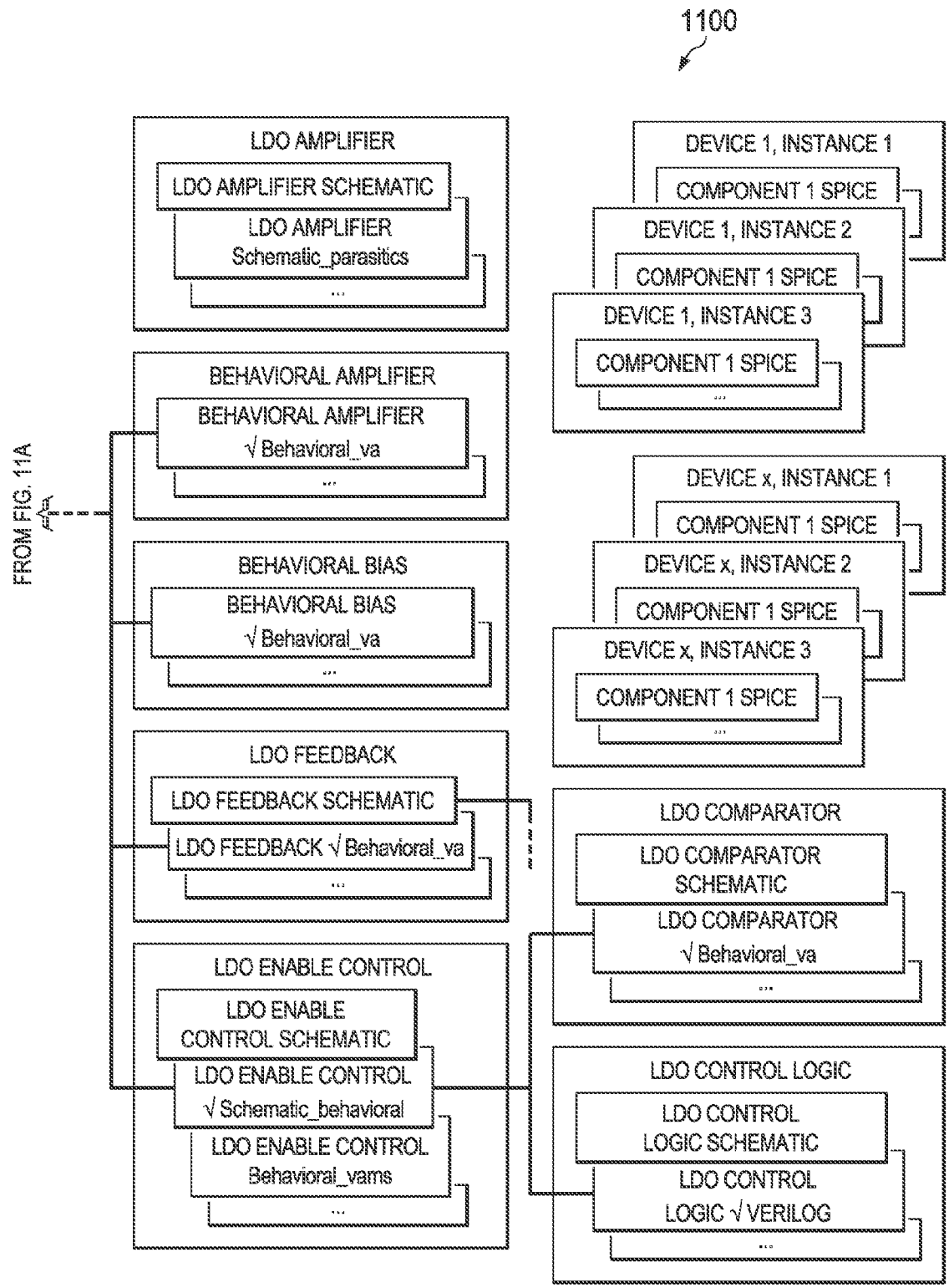

FIGS. 11A and 11B show a test hierarchy for a power management chip 1100. The figure illustrates a portion of the hierarchy for one possible mixed configuration with some analog behavioral level models, some Verilog representations and some Spice primitive components.

Figure 12A:
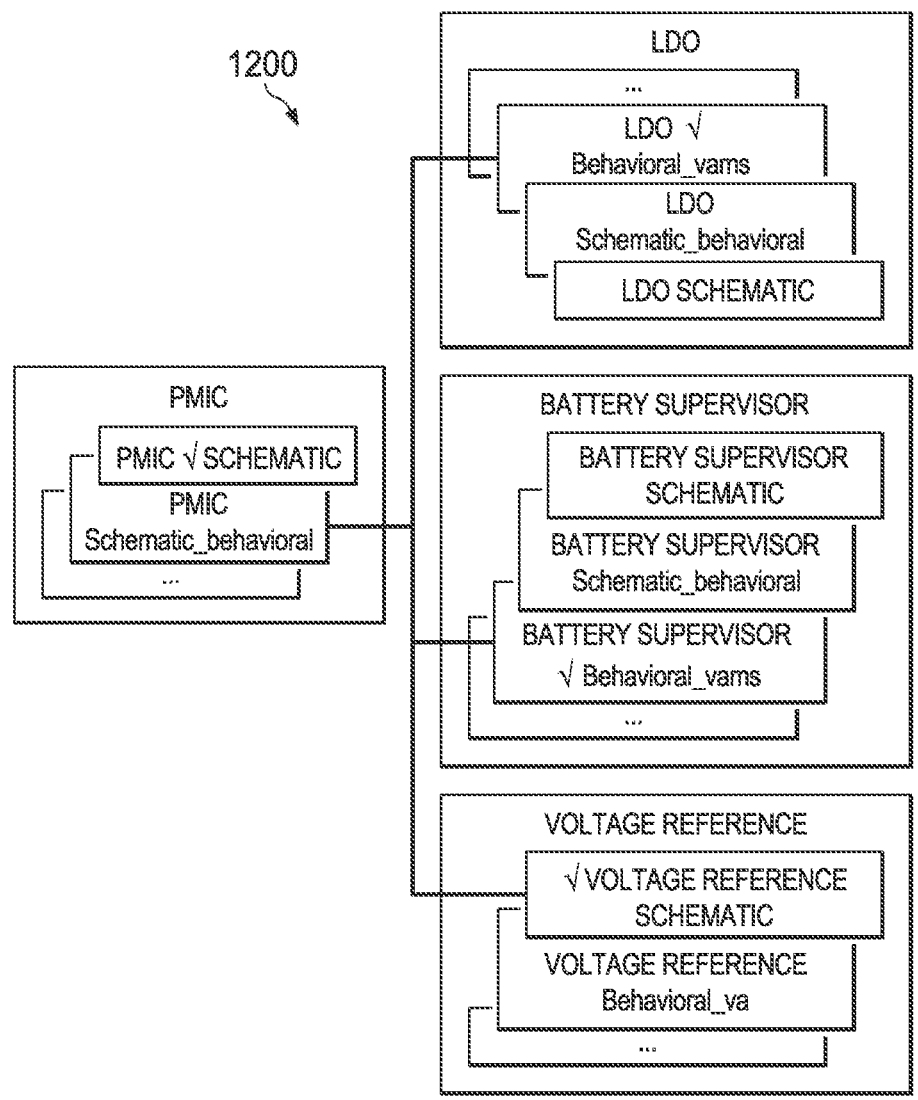
FIGS. 12A and 12B depict a third example design configuration for a power management integrated circuit.
Figure 12B:
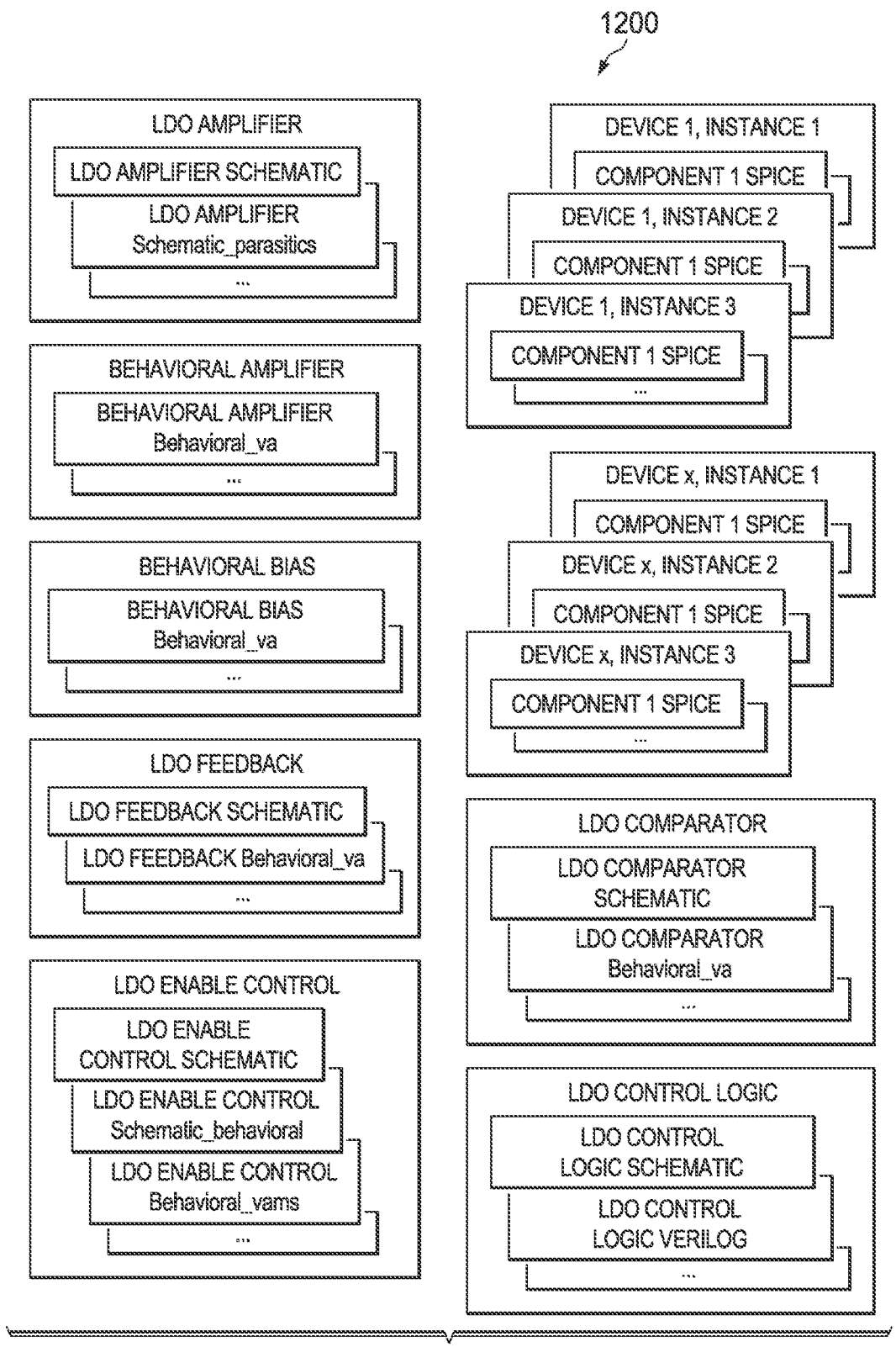

FIGS. 12A and 12B show a test hierarchy for a power management chip 1200. The figure illustrates a portion of the hierarchy if a behavioral configuration is defined.

Figure 13:
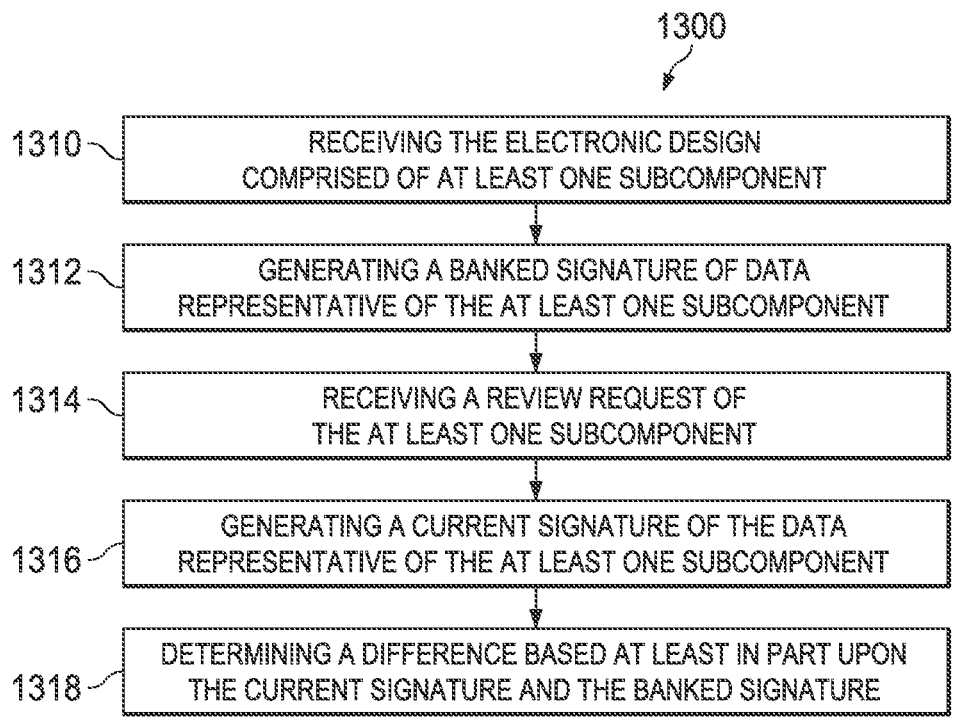
FIG. 13 depicts a first example of change evaluation of an electronic design for verification confirmation.

In one example, FIG. 13 illustrates a computer implemented method of change evaluation 1300 of an electronic design for verification confirmation, comprising the steps of, receiving 1310 at least one subcomponent of the electronic design and employing 1312 a banked signature of data representative of the at least one subcomponent. The computer implemented method further comprises the steps of receiving 1314 a review request of the at least one subcomponent, generating 1316 a current signature of the data representative of the at least one subcomponent and determining 1318 a difference based at least in part upon the current signature and the banked signature. The computer implemented method further comprising the step of updating the banked signature to match the current signature based at least in part upon the determined difference. The banked signature may be a cryptographic signature, a timestamp, a bit copy or the like. The electronic design is envisioned to be analog, digital or mixed signal.

Figure 14:
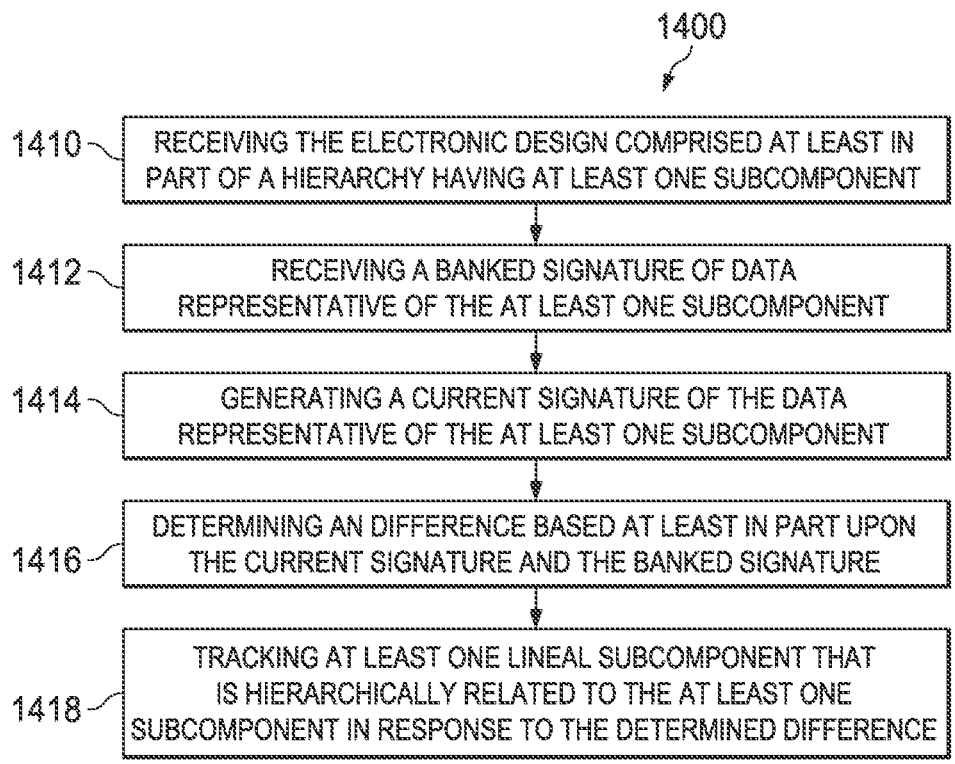
FIG. 14 depicts a second example of change evaluation of an electronic design for verification confirmation.

In another example, FIG. 14 illustrates a computer implemented method of change evaluation 1400 of an electronic design for verification confirmation, comprising the steps of receiving 1410 the electronic design comprised at least in part of a hierarchy having at least one subcomponent and receiving 1412 a banked signature of data representative of the at least one subcomponent. The computer implemented method further comprises the steps of generating 1414 a current signature of the data representative of the at least one subcomponent, determining 1416 a difference based at least in part upon the current signature and the banked signature and tracking 1418 at least one lineal subcomponent that is hierarchically related to the at least one subcomponent in response to the determined difference. A hierarchical relationship is one in which another subcomponent is linked to the modified subcomponent, and is affected by the change in the subcomponent. This change in a linked subcomponent is referred to as a lineal subcomponent since it is in the lineage of the changed subcomponent.

The computer implemented method of FIG. 14 may also comprise the steps of determining a verification history of the electronic design, receiving a verification history of the electronic design and receiving at least one modification of the at least one subcomponent. The computer implemented method may also comprise the steps of evaluating an equivalence of the at least one subcomponent and the at least one modified subcomponent, providing a consequence log based at least in part upon the determined difference, the evaluated equivalence and the at least one lineal subcomponent. The consequence log indicates an effect upon the electronic design resulting from the at least one modification of the at least one subcomponent. The computer implemented method may also comprise the step of determining a verification delta based at least in part upon the consequence log and the verification history. The at least one subcomponent may comprise a definition that has multiple levels of abstraction, where the at least one lineal subcomponent is for a higher level of abstraction and where the at least one lineal subcomponent is for a lower level of abstraction. The consequence log is a set of test benches in the hierarchy that represents a configuration of design. If certain items are changed from a first to a second time the associated test benches need to be rerun. A test bench is a specific configuration of inputs, outputs, test conditions and the like that are run for a device to which it is connected. The example may additionally comprise the step of generating the current signature is performed in response to at least one user's request.

Figure 15:
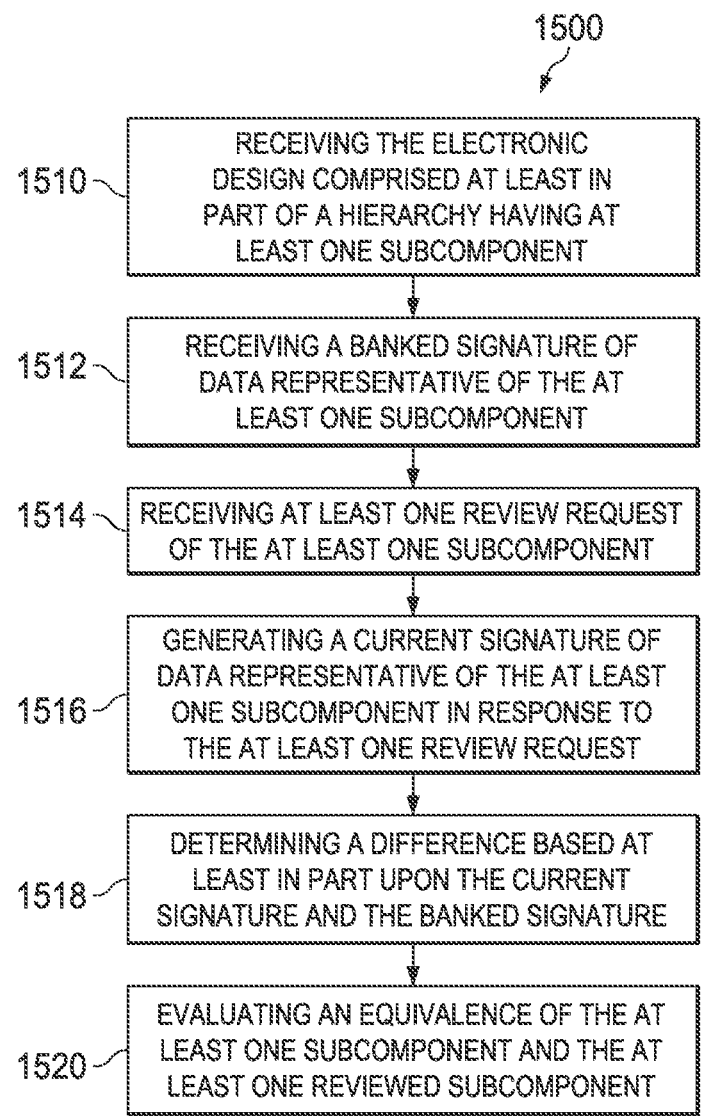
FIG. 15 depicts a third example of change evaluation of an electronic design for verification confirmation.

In a further example, FIG. 15 illustrates a computer implemented method of change evaluation 1500 of an electronic design for verification confirmation comprising the steps of, receiving 1510 the electronic design comprised at least in part of a hierarchy having at least one subcomponent and receiving 1512 a banked signature of data representative of the at least one subcomponent. The computer implemented method further comprises the steps of receiving 1514 at least one review request of the at least one subcomponent and generating 1516 a current signature of data representative of the at least one subcomponent in response to the at least one review request. The computer implemented method further comprises the steps of determining 1518 a difference based at least in part upon the current signature and the banked signature, and evaluating 1520 an equivalence of the at least one subcomponent and the at least one reviewed subcomponent.

The equivalence evaluation may comprise recognizing a structural layout of the at least one subcomponent and the at least one reviewed subcomponent, or mapping of eigenvalues of the at least one subcomponent and the at least one reviewed subcomponent, or defining mappings between behavioral and electrical domains and calculating of deviation between the behavioral and electrical implementation of the at least one subcomponent and the at least one reviewed subcomponent, or the like.

Figure 16:
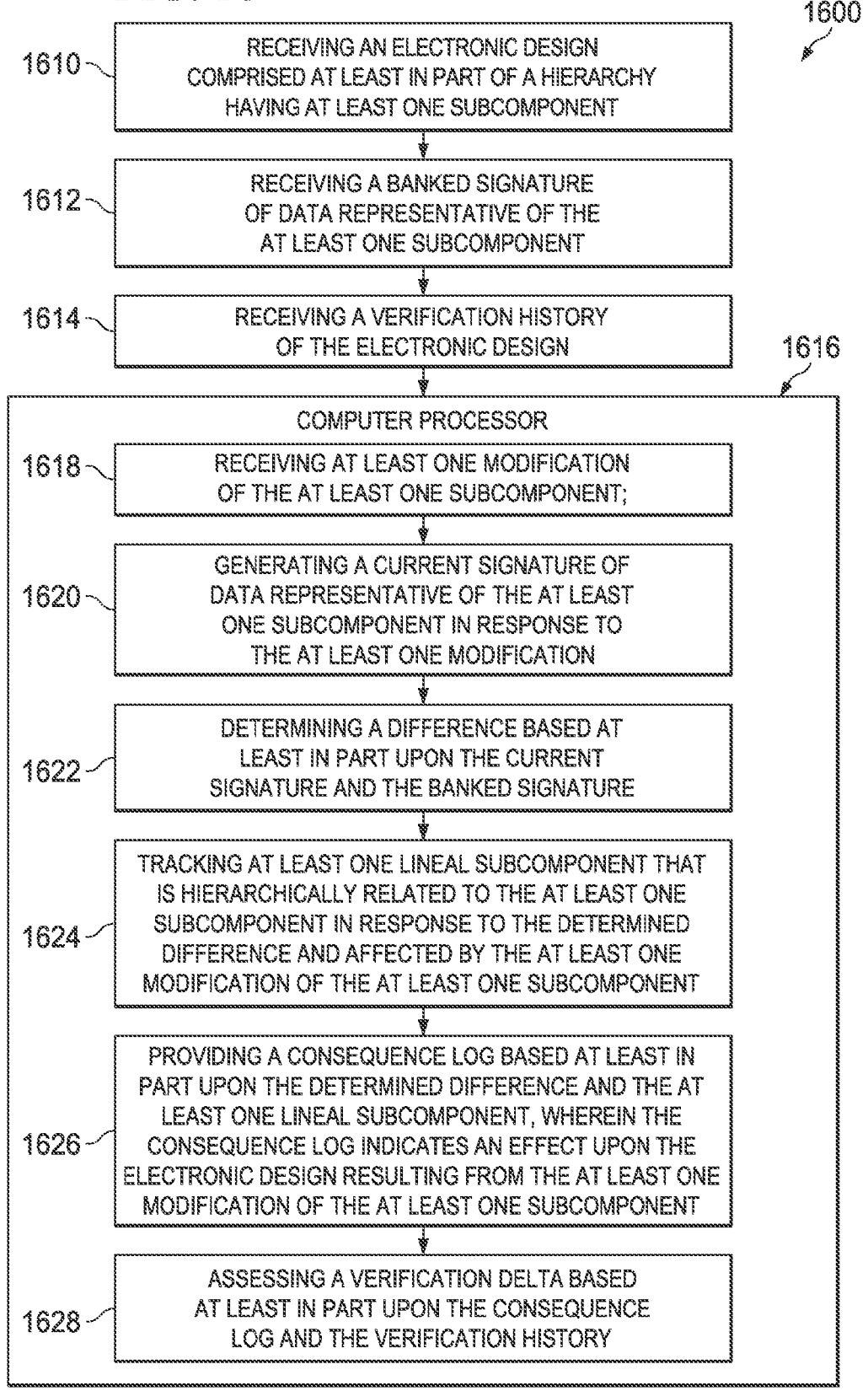
FIG. 16 depicts a computer program product of confirming verification based on change evaluation of an electronic design that has been subject to modification.

In a further example, FIG. 16 illustrates a computer program product 1600 embodied on a non-transitory computer usable medium, the non-transitory computer usable medium having stored thereon a sequence of instructions which, when executed by a processor causes the processor to execute a method of change evaluation of an electronic design for verification confirmation that has been subject to modification. The computer program product embodied on a non-transitory computer usable medium comprises the steps of receiving 1610 the electronic design comprised at least in part of a hierarchy having at least one subcomponent, receiving 1612 a banked signature of data representative of the at least one subcomponent and receiving 1614 a verification history of the electronic design. The computer program product embodied on a non-transitory computer usable medium uses a computer processor 1616 to receive 1618 at least one modification of the at least one subcomponent. The computer program product embodied on a non-transitory computer usable medium further comprises the steps of generating 1620 a current signature of data representative of the at least one subcomponent in response to the at least one modification, determining 1622 a difference based at least in part upon the current signature and the banked signature and tracking 1624 at least one lineal subcomponent that is hierarchically related to the at least one subcomponent in response to the determined difference and effected by the at least one modification of the at least one subcomponent. Further, the computer program product embodied on a non-transitory computer usable medium comprises the steps of providing 1626 a consequence log based at least in part upon the determined difference and the at least one lineal subcomponent, where the consequence log indicates an effect upon the electronic design resulting from the at least one modification of the at least one subcomponent and assessing 1628 a verification delta based at least in part upon the consequence log and the verification history. The hierarchical relations may comprise at least a system level, an architectural level, a dataflow level, an electrical level, a device level and a technology level.

Figure 17:
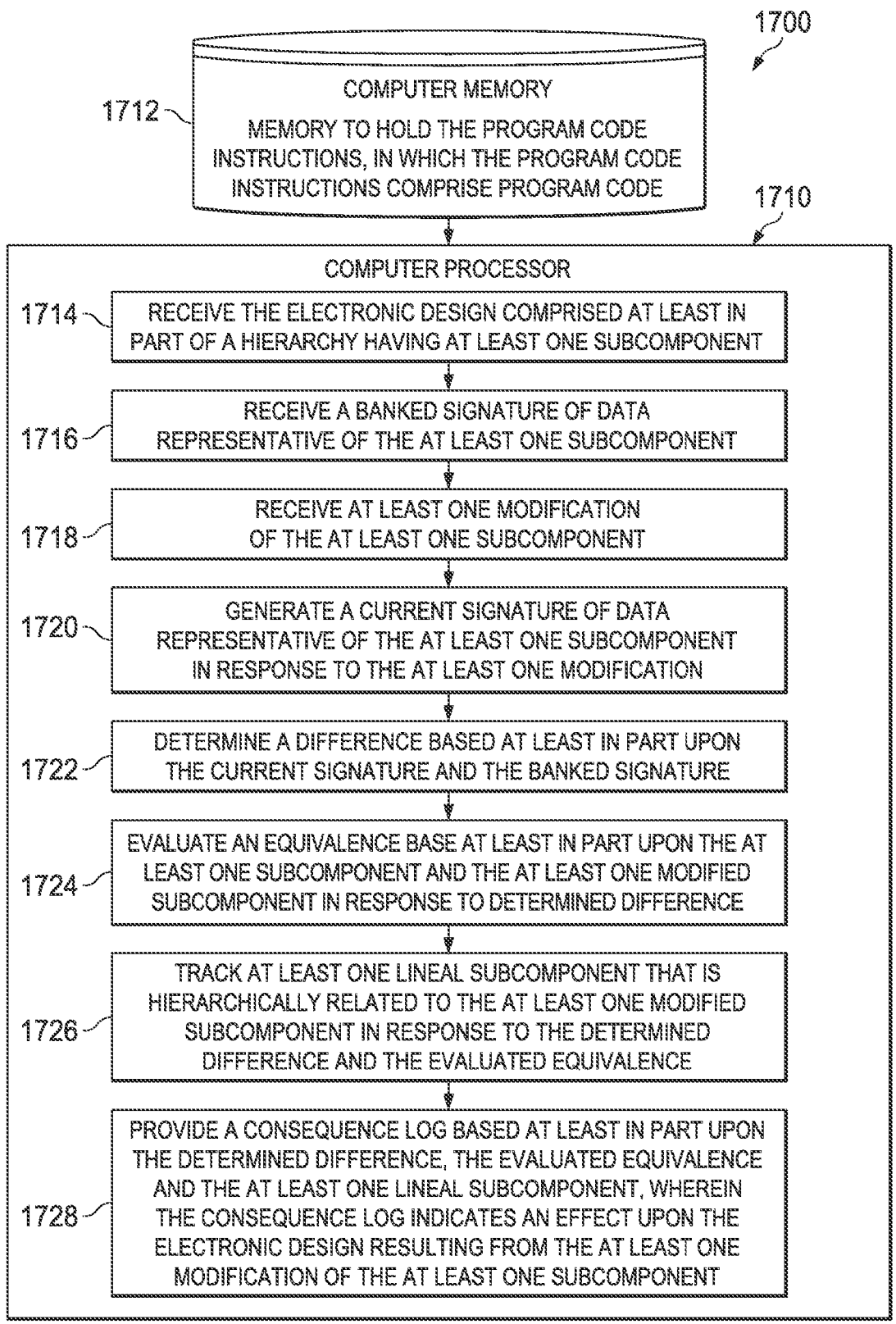
FIG. 17 depicts a computer-based system of confirming verification based on change evaluation of an electronic design that has been subject to modification.

In another example, FIG. 17 illustrates a computer-based system 1700 of confirming verification based on change evaluation of an electronic design that has been subject to modification, comprising, a computer processor 1710 to execute a set of program code instructions, a memory 1712 to hold the program code instructions, in which the program code instructions comprises program code, to receive 1714 the electronic design comprised at least in part of a hierarchy having at least one subcomponent and to receive 1716 a banked signature of data representative of the at least one subcomponent. The computer processor is used to receive 1718 at least one modification of the at least one subcomponent, to generate 1720 a current signature of data representative of the at least one subcomponent in response to the at least one modification, to determine 1722 a difference based at least in part upon the current signature and the banked signature and to evaluate 1724 an equivalence base at least in part upon the at least one subcomponent and the at least one modified subcomponent in response to determined difference. The computer processor is further used to track 1726 at least one lineal subcomponent that is hierarchically related to the at least one modified subcomponent in response to the determined difference and the evaluated equivalence and to provide 1728 a consequence log based at least in part upon the determined difference, the evaluated equivalence and the at least one lineal subcomponent, where the consequence log indicates an effect upon the electronic design resulting from the at least one modification of the at least one subcomponent.

Figure 18:
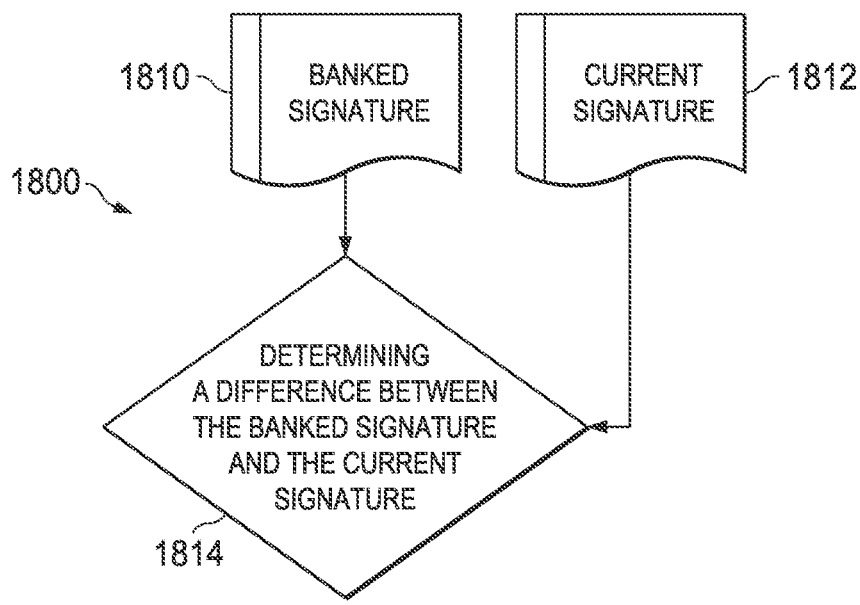
FIG. 18 depicts a method of difference determination.

FIG. 18 illustrates the determination 1800 of a difference in banked 1810 and current signature 1812. The difference determination of the signatures 1814 may be a cryptographic signature, time stamp signature, bit copy signature or the like. It is envisioned that the signature of the file may be calculated in other ways.

Figure 19:
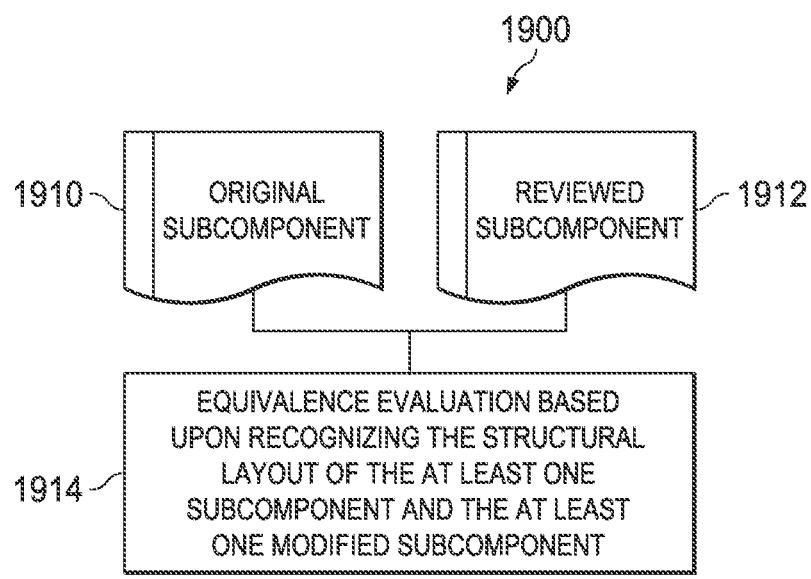
FIG. 19 depicts a first example of equivalence evaluation for verification confirmation.

FIG. 19 illustrates that the equivalence evaluation 1900 between the original subcomponent 1910 and the reviewed subcomponent 1912 may be based upon recognizing 1914 the structural layout of said at least one subcomponent and said at least one modified subcomponent.

Figure 20:
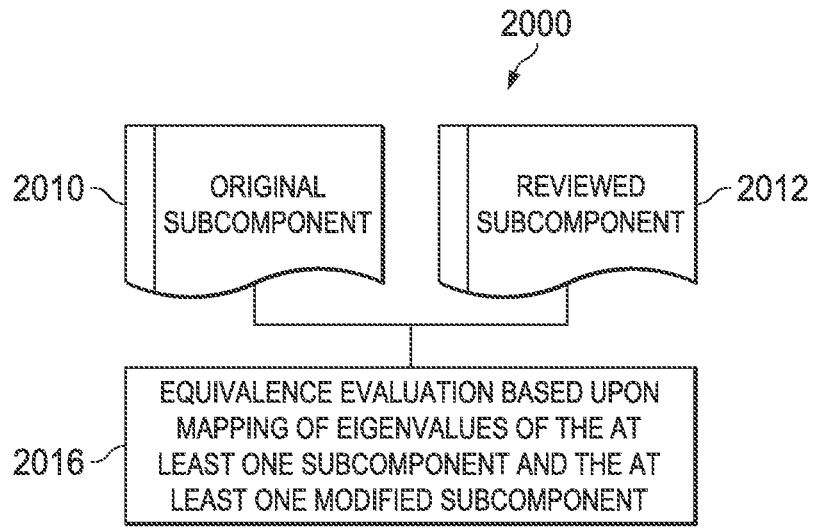
FIG. 20 depicts a second example of equivalence evaluation for verification confirmation.

FIG. 20 illustrates that the equivalence evaluation 2000 between the original subcomponent 2010 and the reviewed subcomponent 2012 may be based upon mapping 2014 of eigenvalues of said at least one subcomponent and said at least one modified subcomponent.

Figure 21:
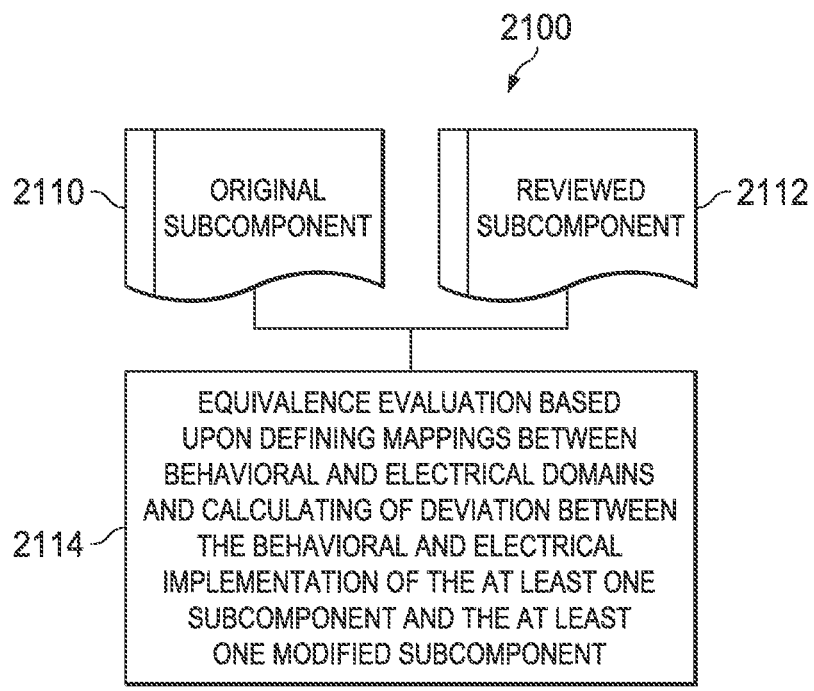
FIG. 21 depicts a third example of equivalence evaluation for verification confirmation.

FIG. 21 illustrates that the equivalence evaluation 2100 between the original subcomponent 2110 and the reviewed subcomponent 2112 may be based upon mappings 2114 between behavioral and electrical domains and calculating of deviation between the behavioral and electrical implementation of said at least one subcomponent and said at least one modified subcomponent.

Figure 22:
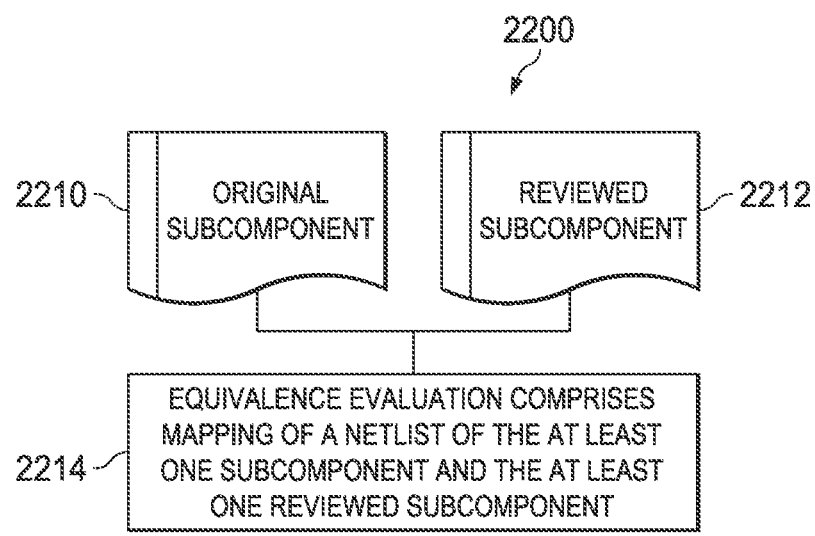
FIG. 22 depicts a fourth example of equivalence evaluation for verification confirmation.

FIG. 22 illustrates that the equivalence evaluation 2200 between the original subcomponent 2210 and the reviewed subcomponent 2212 may be based upon mappings 2214 of a netlist of the at least one subcomponent and the at least one reviewed subcomponent.

Figure 23:
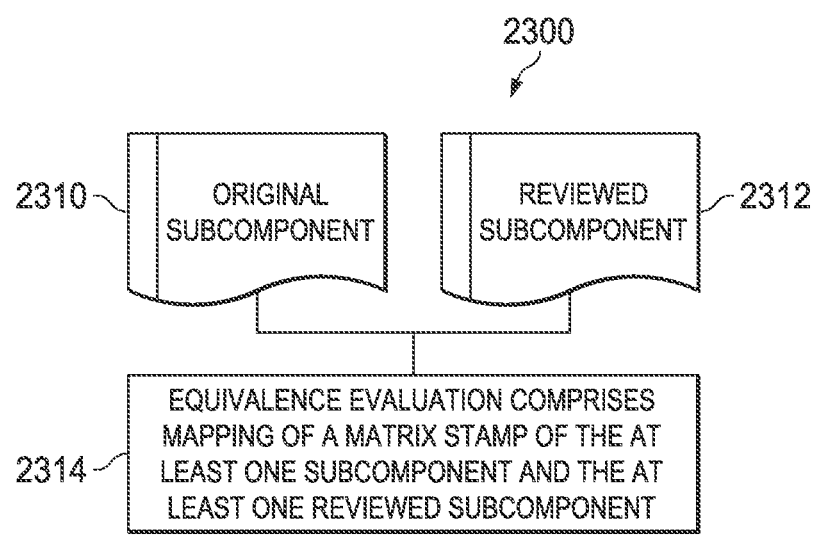
FIG. 23 depicts a fourth example of equivalence evaluation for verification confirmation.

FIG. 23 illustrates that the equivalence evaluation 2300 between the original subcomponent 2310 and the reviewed subcomponent 2312 may be based upon mappings 2314 of a matrix stamp of the at least one subcomponent and the at least one reviewed subcomponent.

Figure 24:
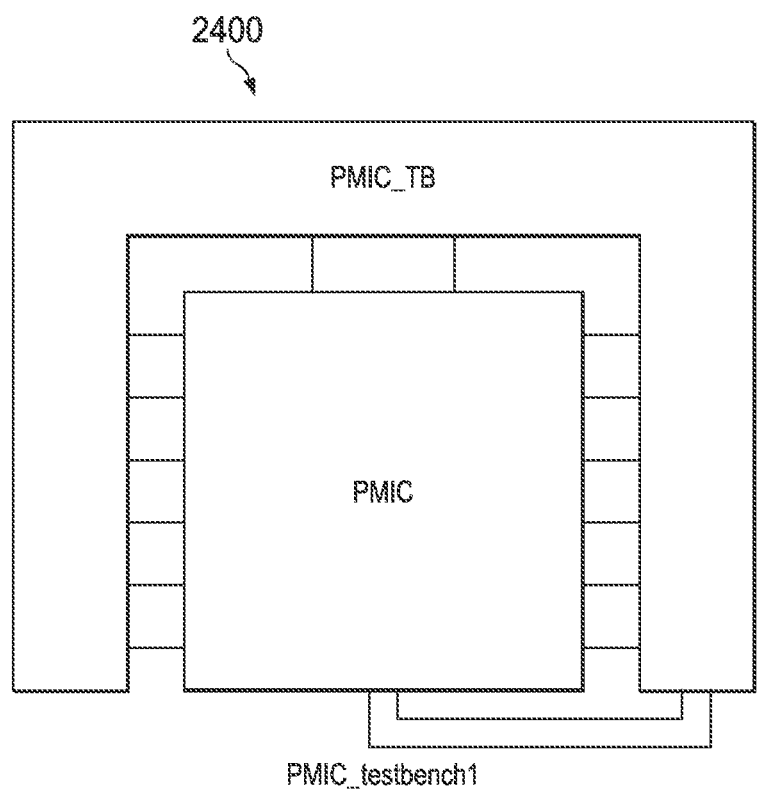
FIG. 24 depicts a schematic of a PMIC_testbench1 configuration.

FIG. 24 illustrates a schematic of PMIC_testbench1. This schematic has 2 instances: PMIC and PMIC_TB, shown in FIGS. 25 and 26.

Figure 25:
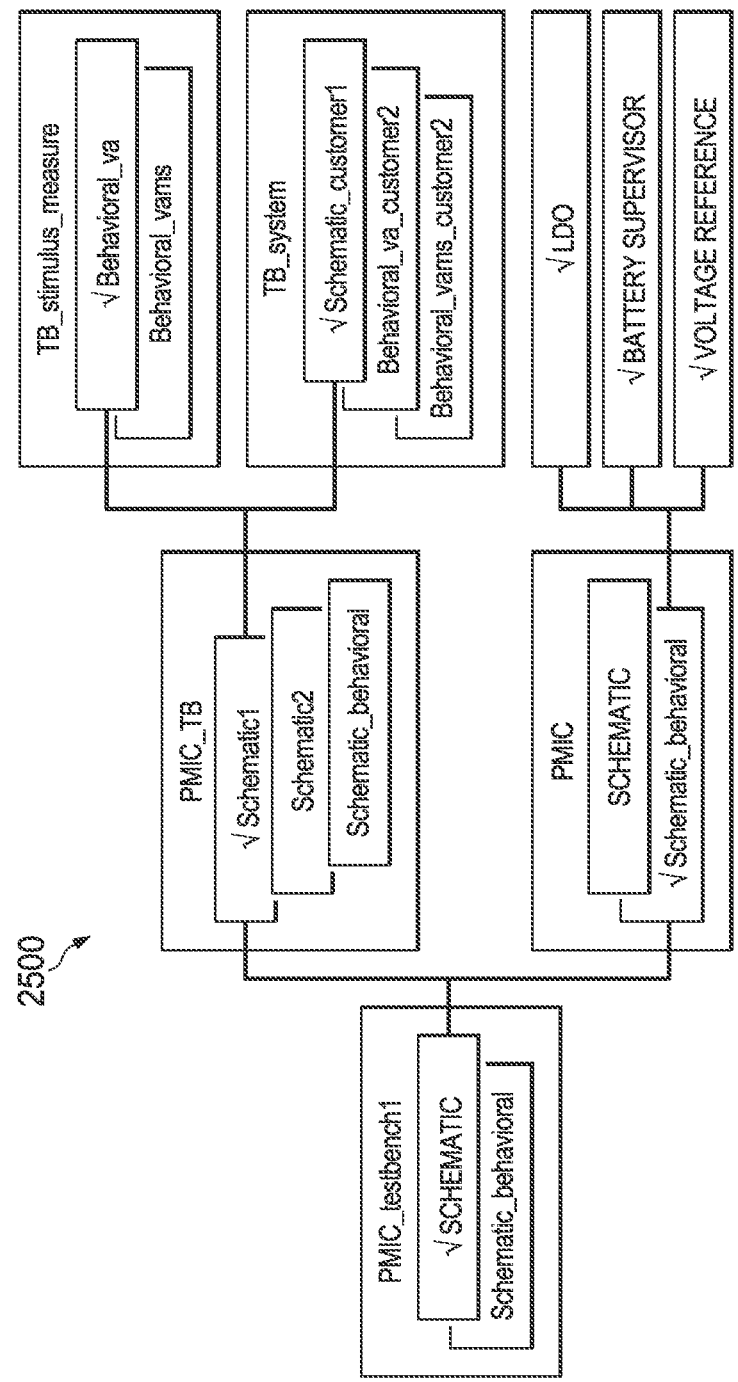
FIG. 25 depicts a first example of a design configuration of the design hierarchy for PMIC_testbench1.

FIG. 25 illustrates one possible configuration or representation of the design hierarchy for PMIC_testbench1. The PMIC_TB design representation Schematic1 includes TB_stimulus_measure Behavioral_va view and TB_system Schematic_customer1. PMIC Schematic_behavioral design configuration includes the LDO, Battery Supervisor, and Voltage reference blocks.

Figure 26:
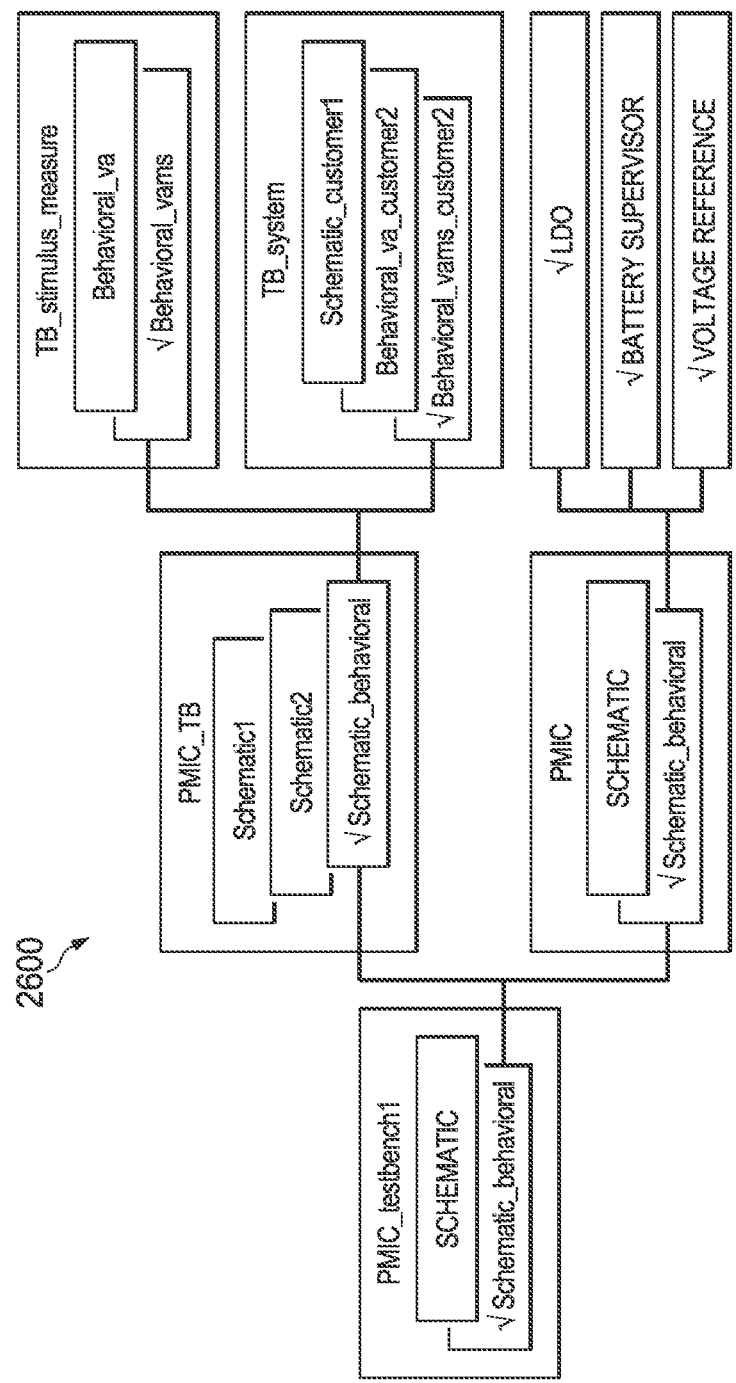
FIG. 26 depicts a second example of a design configuration of the design hierarchy for PMIC_testbench1.

FIG. 26 illustrates an alternate possible configuration where the PMIC configuration does not change but now PMIC_TB Schematic_behavioral uses TB_stimulus_measure Behavioral_vams view and TB_system Behavioral_vams_customer2 view. As with changes to the electronic design, changes in portions of PMIC_TB are relevant in the case of the change impacting the specific configuration used in a given verification run. Changes to the test bench configurations effect changes equivalent to changes in the electronic design. Different test benches may be utilized for blocks within the design hierarchy such as for the LDO or the LDO Amplifier.

Figure 27:
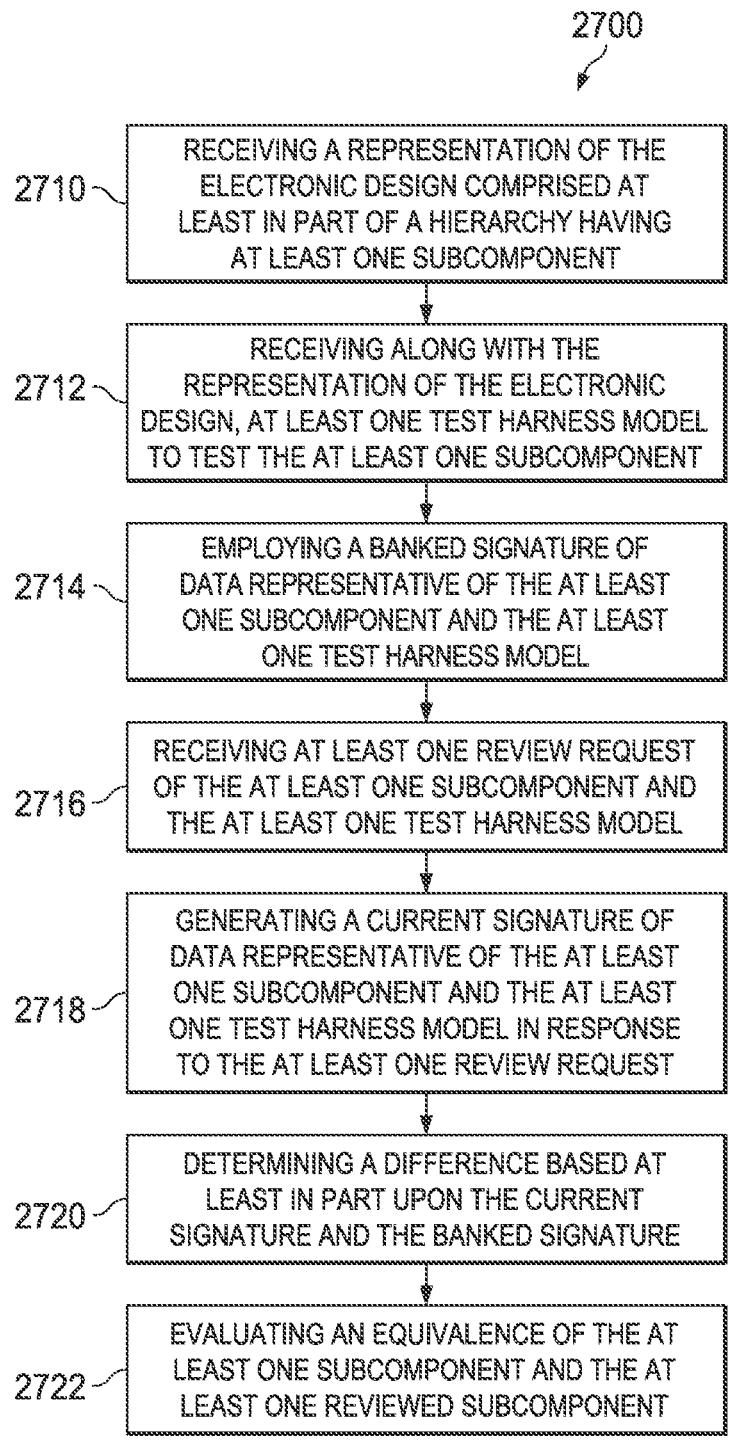
FIG. 27 depicts a fifth example of equivalence evaluation including test bench configuration for verification confirmation.

FIG. 27 illustrates a computer implemented method 2700 of change evaluation of an electronic design for verification confirmation, comprising the steps of receiving 2710 a representation of the electronic design comprised at least in part of a hierarchy having at least one subcomponent, receiving 2712 along with the representation of the electronic design, at least one test harness model to test the at least one subcomponent and employing 2714 a banked signature of data representative of the at least one subcomponent and the at least one test harness model. The method also includes the steps of receiving 2716 at least one review request of the at least one subcomponent and the at least one test harness model, generating 2718 a current signature of data representative of the at least one subcomponent and the at least one test harness model in response to the at least one review request, determining 2720 a difference based at least in part upon the current signature and the banked signature and evaluating 2722 an equivalence of the at least one subcomponent and the at least one reviewed subcomponent. The at least one test harness model may be analog, digital and/or mixed signal. The representation of the electronic design may also be analog, digital and/or mixed signal.

While the making and using of various exemplary examples of the disclosure are discussed herein, it is to be appreciated that the present disclosure provides concepts which may be described in a wide variety of specific contexts. Although the disclosure has been shown and described with respect to a certain example, it is obvious that equivalents and modifications will occur to others skilled in the art upon the reading and understanding of the specification. The present disclosure includes such equivalents and modifications, and is limited only by the scope of the following claims.

It is to be understood that the method and apparatus may be practiced locally or remotely and that the data for steps may be stored either locally or remotely. For purposes of clarity, detailed descriptions of functions, components, and systems familiar to those skilled in the applicable arts are not included. The methods and apparatus of the disclosure provide one or more advantages including which are not limited to, improved speed efficiency, decreased computation, decreased number of re-verifications and the like. While the disclosure has been described with reference to certain illustrative examples, those described herein are not intended to be construed in a limiting sense. For example, variations or combinations of steps or materials in the examples shown and described may be used in particular cases while not departing from the disclosure. Various modifications and combinations of the illustrative examples as well as other advantages and examples will be apparent to persons skilled in the arts upon reference to the drawings, description, and claims.

What is claimed is:

1. A computer implemented method of change evaluation of an electronic design file for design verification confirmation prior to fabrication of an electronic circuit defined by the electronic design file, comprising the steps of:

receiving, at a processor, a representation of said electronic design file defining the electronic circuit, the representation comprised at least in part of a hierarchy of the electronic circuit having at least one subcomponent of the electronic circuit, wherein the electronic design file defines a functional level electronic design of the electronic circuit;

receiving, at the processor, along with said representation of said electronic design file, at least one test harness model to test said at least one subcomponent of the electronic circuit defined by the electronic design file;

storing, at the processor, a banked signature of data representative of said at least one subcomponent of the electronic circuit defined by the electronic design file and said at least one test harness model associated with the electronic design file;

receiving, at the processor, at least one review request of said at least one subcomponent of the electronic circuit defined by the electronic design file and said at least one test harness model associated with the electronic design file;

generating, at the processor, a current signature of data representative of said at least one subcomponent of the electronic circuit defined by the electronic design file and said at least one test harness model associated with the electronic design file in response to said at least one review request;

determining, at the processor, a difference based at least in part upon said current signature associated with the electronic design file and said banked signature associated with the electronic design file; and evaluating, at the processor, an equivalence of said at least one subcomponent of the electronic circuit defined by the electronic design file and said at least one reviewed subcomponent of the electronic circuit defined by the electronic design file.

2. The computer implemented method of change evaluation of the functional level electronic design for verification confirmation of claim 1, wherein said at least one test harness model associated with the electronic design file is analog.

3. The computer implemented method of change evaluation of the functional level electronic design for verification confirmation of claim 1, wherein said at least one test harness model associated with the electronic design file is mixed signal.

4. The computer implemented method of change evaluation of the functional level electronic design for verification confirmation of claim 1, wherein said at least one test harness model associated with the electronic design file is digital.

5. The computer implemented method of change evaluation of the functional level electronic design for verification confirmation of claim 1, wherein said banked signature associated with the electronic design file is at least one of a cryptographic signature, a timestamp and a bit copy.

6. The computer implemented method of change evaluation of the functional level electronic design for verification confirmation of claim 1, further comprising at least one of determining a verification history of said electronic design and receiving said verification history of said electronic design.

7. The computer implemented method of change evaluation of the functional level electronic design for verification confirmation of claim 1, further comprising receiving at least one modification of said at least one subcomponent of the electronic circuit defined by the electronic design file.

8. A computer-based system of confirming verification based on change evaluation of an electronic design file that has been subject to modification, prior to fabrication of an electronic circuit defined by the electronic design file, comprising:

a computer processor to execute a set of program code instructions;

a memory to hold a banked signature associated with the electronic design file and said program code instructions, in which said program code instructions comprises program code to;

receive, at the processor, a representation of said electronic design file comprised at least in part of a hierarchy of the electronic circuit having at least one subcomponent of the electronic circuit, wherein the electronic design file defines a functional level electronic design of the electronic circuit;

receive, at the processor, along with said representation of said electronic design file, at least one test harness model to test said at least one subcomponent of the electronic circuit defined by the electronic design file;

receive, at the processor, at least one review request of said at least one subcomponent of the electronic circuit defined by the electronic design file and said at least one test harness model associated with the electronic design file;

store, at the processor, a banked signature associated with the electronic design file of data representative of said at least one subcomponent of the electronic circuit defined by the electronic design file and said at least one test harness model associated with the electronic design file;

generating, at the processor, a current signature associated with the electronic design file of data representative of said at least one subcomponent of the electronic circuit defined by the electronic design file and said at least one test harness model associated with the electronic design file in response to said at least one review request;

determine, at the processor, a difference based at least in part upon said current signature associated with the electronic design file and said banked signature associated with the electronic design file; and evaluating, at the processor, an equivalence of said at least one subcomponent of the electronic circuit defined by the electronic design file and said at least one reviewed subcomponent of the electronic circuit defined by the electronic design file.

9. The system of claim 8, wherein said at least one test harness model associated with the electronic design file is analog.

10. The system of claim 8, wherein said at least one test harness model associated with the electronic design file is mixed signal.

11. The system of claim 8, wherein said at least one test harness associated with the electronic design file model is digital.

12. The system of claim 8, wherein said banked signature associated with the electronic design file is at least a cryptographic signature.

13. The system of claim 8, wherein said banked signature associated with the electronic design file is at least a timestamp.

14. The system of claim 8, wherein said banked signature associated with the electronic design file is at least a bit copy.

15. A non-transitory computer readable storage medium configured to store instructions that when executed causes at least one processor to perform:

receiving, at the processor, a representation of an electronic design file comprised at least in part of a hierarchy of an electronic circuit having at least one subcomponent of the electronic circuit, wherein the electronic design file defines a functional level electronic design of the electronic circuit;

receiving, at the processor, along with said representation of said electronic design file, at least one test harness model to test said at least one subcomponent of the electronic circuit defined by the electronic design file;

retrieving, at the processor, a banked signature of data representative of said at least one subcomponent of the electronic circuit defined by the electronic design file and said at least one test harness model associated with the electronic design file;

receiving, at the processor, at least one review request of said at least one subcomponent of the electronic circuit defined by the electronic design file and said at least one test harness model associated with the electronic design file;

generating, at the processor, a current signature of data representative of said at least one subcomponent of the electronic circuit and said at least one test harness model associated with the electronic design file in response to said at least one review request;

determining, at the processor, a difference based at least in part upon said current signature associated with the electronic design file and said banked signature associated with the electronic design file; and evaluating, at the processor, an equivalence of said at least one subcomponent of the electronic circuit defined by the electronic design file and said at least one reviewed subcomponent of the electronic circuit defined by the electronic design file.

16. The non-transitory computer readable storage medium of claim 15, wherein said functional level electronic design is analog.

17. The non-transitory, computer readable storage medium of claim 15, wherein said functional level electronic design is mixed signal.

18. The non-transitory, computer readable storage medium of claim 15, wherein said banked signature associated with the electronic design file is a cryptographic signature.

19. The non-transitory, computer readable storage medium of claim 15, wherein said banked signature associated with the electronic design file is a timestamp.

20. The non-transitory, computer readable storage medium of claim 15, wherein said banked signature associated with the electronic design file is a bit copy.

* * * * *